(12) United States Patent
Briano et al.

(10) Patent No.: US 11,115,244 B2
(45) Date of Patent: Sep. 7, 2021

(54) SIGNAL ISOLATOR WITH THREE STATE DATA TRANSMISSION

(71) Applicant: Allegro MicroSystems, LLC, Manchester, NH (US)

(72) Inventors: Robert A. Briano, Auburn, NH (US); Pedram Sotoodeh Shahnani, Manchester, NH (US); Cory Voisine, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/809,825

(22) Filed: Mar. 5, 2020

(65) Prior Publication Data
US 2021/0083907 A1 Mar. 18, 2021

Related U.S. Application Data

(60) Provisional application No. 62/901,491, filed on Sep. 17, 2019.

(51) Int. Cl.
*H04L 25/02* (2006.01)
*H04B 17/17* (2015.01)
*H03K 19/00* (2006.01)

(52) U.S. Cl.
CPC ..... *H04L 25/0266* (2013.01); *H03K 19/0002* (2013.01); *H04B 17/17* (2015.01)

(58) Field of Classification Search
None
See application file for complete search history.

(56) References Cited

U.S. PATENT DOCUMENTS

| 3,058,078 A | 10/1962 | Hoh |
| 3,537,022 A | 10/1970 | Regan |

(Continued)

FOREIGN PATENT DOCUMENTS

| DE | 10100282 | 7/2002 |
| FR | 267670 | 7/1991 |

(Continued)

OTHER PUBLICATIONS

Response (with Amended Claims) to European Rule 161/162 Communication dated Oct. 17, 2019 and ISA Written Opinion dated Apr. 6, 2018 for European Application No. 18706886.1; Response filed Apr. 23, 2020; 14 Pages.

(Continued)

*Primary Examiner* — Lincoln D Donovan
*Assistant Examiner* — Khareem E Almo
(74) *Attorney, Agent, or Firm* — Daly, Crowley, Mofford & Durkee, LLP

(57) ABSTRACT

A signal isolator integrated circuit package includes a first circuit having a first input and a first output, a second circuit having a second input and a second output, an isolation barrier layer between the first circuit and the second circuit, wherein the second output of the second circuit is coupled to the first input of the first circuit through the isolation barrier. The signal isolator includes a comparator configured to compare the first input of the first circuit to the second output of the second circuit. The second output can be configured to convey at least three states, including a first state indicative of a logical high of an input signal received at the first input, a second state indicative of a logical low of the input signal, and a third state indicative of a fault condition.

27 Claims, 13 Drawing Sheets

(56) References Cited

U.S. PATENT DOCUMENTS

| | | |
|---|---|---|
| 3,624,529 A | 11/1971 | Gebelein, Jr. |
| 3,691,305 A | 9/1972 | Huebner et al. |
| 3,713,148 A | 1/1973 | Cardullo et al. |
| 3,714,540 A | 1/1973 | Galloway |
| 3,760,198 A | 9/1973 | Mori et al. |
| 3,798,608 A | 3/1974 | Huebner |
| 3,859,624 A | 1/1975 | Kriofsky et al. |
| 4,024,452 A | 5/1977 | Seidel |
| 4,027,152 A | 5/1977 | Brown et al. |
| 4,118,603 A | 10/1978 | Kumhyr |
| 4,188,927 A | 2/1980 | Harris |
| 4,227,045 A | 10/1980 | Chelcun et al. |
| 4,302,807 A | 11/1981 | Mentler |
| 4,360,784 A | 11/1982 | Bartlett |
| 4,399,557 A | 8/1983 | Muszkiewicz |
| 4,425,647 A | 1/1984 | Collins et al. |
| 4,459,591 A | 7/1984 | Haubner et al. |
| 4,526,128 A | 7/1985 | Sorace et al. |
| 4,538,136 A | 8/1985 | Drabing |
| 4,547,961 A | 10/1985 | Bokil et al. |
| 4,650,981 A | 3/1987 | Foletta |
| 4,660,014 A | 4/1987 | Wenaas et al. |
| 4,675,579 A | 6/1987 | Hardy et al. |
| 4,703,283 A | 10/1987 | Samuels |
| 4,748,419 A | 5/1988 | Somerville |
| 4,763,075 A | 8/1988 | Weigert |
| 4,780,795 A | 10/1988 | Meinel |
| 4,785,345 A | 11/1988 | Rawls et al. |
| 4,791,326 A | 12/1988 | Vajdic et al. |
| 4,817,865 A | 4/1989 | Wray |
| 4,818,855 A | 4/1989 | Mongeon et al. |
| 4,825,450 A | 4/1989 | Herzog |
| 4,835,486 A | 5/1989 | Somerville |
| 4,853,654 A | 8/1989 | Sakurai |
| 4,859,877 A | 8/1989 | Cooperman et al. |
| 4,864,437 A | 9/1989 | Couse et al. |
| 4,868,647 A | 9/1989 | Uehara et al. |
| 4,885,582 A | 12/1989 | LaBarge et al. |
| 4,922,883 A | 5/1990 | Iwasaki |
| 4,924,210 A | 5/1990 | Matsui et al. |
| 4,931,867 A | 6/1990 | Kikuchi |
| 4,937,468 A | 6/1990 | Shekhawat et al. |
| 4,945,264 A | 7/1990 | Lee et al. |
| 4,959,631 A | 9/1990 | Hasegawa et al. |
| 5,041,780 A | 8/1991 | Rippel |
| 5,057,968 A | 10/1991 | Morrison |
| 5,077,486 A | 12/1991 | Marson et al. |
| 5,095,357 A | 3/1992 | Andoh et al. |
| 5,102,040 A | 4/1992 | Harvey |
| 5,125,111 A | 6/1992 | Trinh |
| 5,142,432 A | 8/1992 | Schneider |
| 5,164,621 A | 11/1992 | Miyamoto |
| 5,168,863 A | 12/1992 | Kurtzer |
| 5,204,551 A | 4/1993 | Bjornholt |
| 5,270,882 A | 12/1993 | Jove et al. |
| 5,293,400 A | 3/1994 | Monod et al. |
| 5,369,666 A | 11/1994 | Folwell et al. |
| 5,384,808 A | 1/1995 | Van Brunt et al. |
| 5,396,394 A | 3/1995 | Gee |
| 5,404,545 A | 4/1995 | Melvin |
| 5,418,933 A | 5/1995 | Kimura et al. |
| 5,424,709 A | 6/1995 | Tal |
| 5,442,303 A | 8/1995 | Asada et al. |
| 5,444,740 A | 8/1995 | Mizukami et al. |
| 5,448,469 A | 9/1995 | Rilly et al. |
| 5,467,607 A | 11/1995 | Harvey |
| 5,469,098 A | 11/1995 | Johnson, Jr. |
| 5,484,012 A | 1/1996 | Hiratsuka |
| 5,533,054 A | 7/1996 | DeAndrea et al. |
| 5,539,598 A | 7/1996 | Denison et al. |
| 5,555,421 A | 9/1996 | Enzinna |
| 5,568,333 A | 10/1996 | Bang |
| 5,572,179 A | 11/1996 | Ito et al. |
| 5,574,396 A | 11/1996 | Drainville |
| 5,588,021 A | 12/1996 | Hunt et al. |
| 5,591,996 A | 1/1997 | Haigh et al. |
| 5,596,466 A | 1/1997 | Ochi |
| 5,615,091 A | 3/1997 | Palatnik |
| 5,615,229 A | 3/1997 | Sharma et al. |
| 5,625,265 A | 4/1997 | Vlahu |
| 5,627,480 A | 5/1997 | Young et al. |
| 5,627,488 A | 5/1997 | Tanzawa et al. |
| 5,650,357 A | 7/1997 | Dobkin et al. |
| 5,654,984 A | 8/1997 | Hershbarger et al. |
| 5,663,672 A | 9/1997 | Nuechterlein |
| 5,701,037 A | 12/1997 | Weber et al. |
| 5,714,938 A | 2/1998 | Schwabl |
| 5,716,323 A | 2/1998 | Lee |
| 5,731,727 A | 3/1998 | Iwamoto et al. |
| 5,731,954 A | 3/1998 | Cheon |
| 5,774,791 A | 6/1998 | Strohallen et al. |
| 5,781,071 A | 7/1998 | Kusunoki |
| 5,781,077 A | 7/1998 | Leitch et al. |
| 5,786,763 A | 7/1998 | Canipe |
| 5,786,979 A | 7/1998 | Douglass |
| 5,801,602 A | 9/1998 | Fawal et al. |
| 5,812,597 A | 9/1998 | Graham et al. |
| 5,812,598 A | 9/1998 | Sharma et al. |
| 5,825,259 A | 10/1998 | Harpham |
| 5,831,426 A | 11/1998 | Black, Jr. et al. |
| 5,831,525 A | 11/1998 | Harvey |
| 5,844,743 A | 12/1998 | Funches |
| 5,845,190 A | 12/1998 | Bushue et al. |
| 5,850,436 A | 12/1998 | Rosen et al. |
| 5,864,607 A | 1/1999 | Rosen et al. |
| 5,900,683 A | 5/1999 | Rinehart et al. |
| 5,907,481 A | 5/1999 | Svardsjo |
| 5,913,817 A | 6/1999 | Lee |
| 5,926,358 A | 7/1999 | Dobkin et al. |
| 5,945,728 A | 8/1999 | Dobkin et al. |
| 6,049,258 A | 4/2000 | Fawal et al. |
| 6,054,780 A | 4/2000 | Haigh et al. |
| 6,061,009 A | 5/2000 | Krone et al. |
| 6,069,802 A | 5/2000 | Priegnitz |
| 6,081,112 A | 6/2000 | Carobolante et al. |
| 6,082,744 A | 7/2000 | Allinger et al. |
| 6,097,564 A | 8/2000 | Hunter |
| 6,104,003 A | 8/2000 | Jones |
| 6,124,756 A | 9/2000 | Yaklin et al. |
| 6,137,372 A | 10/2000 | Welland |
| 6,220,552 B1 | 4/2001 | Ireland |
| 6,222,922 B1 | 4/2001 | Scott et al. |
| 6,232,902 B1 | 5/2001 | Wada |
| 6,249,171 B1 | 6/2001 | Yaklin et al. |
| 6,262,600 B1 | 7/2001 | Haigh et al. |
| 6,291,907 B1 | 9/2001 | Haigh et al. |
| 6,300,617 B1 | 10/2001 | Daughton et al. |
| 6,307,497 B1 | 10/2001 | Leung et al. |
| 6,323,796 B1 | 11/2001 | Krone et al. |
| 6,384,763 B1 | 5/2002 | Leung et al. |
| 6,385,235 B1 | 5/2002 | Scott et al. |
| 6,389,063 B1 | 5/2002 | Kanekawa et al. |
| 6,396,652 B1 | 5/2002 | Kawachi et al. |
| 6,452,519 B1 | 9/2002 | Swanson |
| 6,456,712 B1 | 9/2002 | Hein et al. |
| 6,525,566 B2 | 2/2003 | Haigh et al. |
| 6,535,858 B1 | 3/2003 | Blaukovitsch et al. |
| 6,538,136 B1 | 3/2003 | Rizzo et al. |
| 6,603,807 B1 | 8/2003 | Yukutake et al. |
| 6,611,051 B2 | 8/2003 | Akiyama et al. |
| 6,670,861 B1 | 12/2003 | Balboni |
| 6,728,320 B1 | 4/2004 | Khasnis et al. |
| 6,747,522 B2 | 6/2004 | Pietruszynski et al. |
| 6,833,800 B1 | 12/2004 | Patterson |
| 6,873,065 B2 | 3/2005 | Haigh et al. |
| 6,902,967 B2 | 6/2005 | Beasom |
| 6,903,578 B2 | 6/2005 | Haigh et al. |
| 6,914,547 B1 | 7/2005 | Swaroop et al. |
| 6,922,080 B2 | 7/2005 | Haigh et al. |
| 6,927,662 B2 | 8/2005 | Kahlmann et al. |
| 6,940,445 B2 | 9/2005 | Kearney |
| 6,956,727 B1 | 10/2005 | Brokaw |
| 6,967,513 B1 | 11/2005 | Balboni |
| 6,977,522 B1 | 12/2005 | Murabayashi et al. |

(56) References Cited

U.S. PATENT DOCUMENTS

| | | | |
|---|---|---|---|
| 7,012,388 B2 | 3/2006 | Lin et al. | |
| 7,016,490 B2 | 3/2006 | Beutler et al. | |
| 7,023,372 B1 | 4/2006 | Singh et al. | |
| 7,053,807 B1 | 5/2006 | Gaalaas | |
| 7,053,831 B2 | 5/2006 | Dempsey et al. | |
| 7,064,442 B1 | 6/2006 | Lane et al. | |
| 7,075,329 B2 | 7/2006 | Chen et al. | |
| 7,082,171 B1 | 7/2006 | Johnson et al. | |
| 7,102,388 B2 | 9/2006 | Murabayashi et al. | |
| 7,110,531 B2 | 9/2006 | Prendergast et al. | |
| 7,259,545 B2 | 8/2007 | Stauth et al. | |
| 7,315,592 B2 | 1/2008 | Tsatsanis et al. | |
| 7,335,199 B2 | 2/2008 | Goble et al. | |
| 7,447,492 B2 | 11/2008 | Dupuis | |
| 7,518,354 B2 | 4/2009 | Stauth et al. | |
| 7,590,334 B2 | 9/2009 | Yabusaki et al. | |
| 7,709,754 B2 | 5/2010 | Doogue et al. | |
| 7,719,305 B2 | 5/2010 | Chen | |
| 7,746,056 B2 | 6/2010 | Stauth et al. | |
| 7,747,146 B2 | 6/2010 | Milano et al. | |
| 7,768,083 B2 | 8/2010 | Doogue et al. | |
| 7,796,076 B2 | 9/2010 | Melanson | |
| 7,871,865 B2 | 1/2011 | Sengupta et al. | |
| 7,902,627 B2 | 3/2011 | Dong et al. | |
| 7,920,010 B2 | 4/2011 | Chen, Jr. et al. | |
| 7,923,996 B2 | 4/2011 | Doogue et al. | |
| 7,948,067 B2 | 5/2011 | Fouquet et al. | |
| 7,973,527 B2 | 7/2011 | Taylor et al. | |
| 8,063,634 B2 | 11/2011 | Sauber et al. | |
| 8,064,872 B2 | 11/2011 | Dupuis | |
| 8,138,593 B2 | 3/2012 | Pagkaliwangan et al. | |
| 8,169,108 B2 | 5/2012 | Dupuis et al. | |
| 8,216,220 B2 | 7/2012 | Jensen et al. | |
| 8,353,905 B2 | 1/2013 | Jensen et al. | |
| 8,447,556 B2 | 5/2013 | Friedrich et al. | |
| 8,542,010 B2 | 9/2013 | Cesaretti et al. | |
| 8,629,520 B2 | 1/2014 | Doogue et al. | |
| 8,680,846 B2 | 3/2014 | Cesaretti et al. | |
| 8,873,644 B1 * | 10/2014 | Todsen | H03M 3/368 375/247 |
| 8,907,437 B2 | 12/2014 | Milano et al. | |
| 8,952,471 B2 | 2/2015 | Doogue et al. | |
| 9,082,957 B2 | 7/2015 | Doogue et al. | |
| 9,325,553 B2 | 4/2016 | Kaukovuori et al. | |
| 9,344,108 B2 | 5/2016 | Hampel et al. | |
| 9,363,004 B2 | 6/2016 | Kis et al. | |
| 9,379,785 B2 | 6/2016 | Shameli et al. | |
| 9,385,790 B1 | 7/2016 | Mukherjee et al. | |
| 9,551,762 B1 | 1/2017 | Cesaretti | |
| 9,559,880 B1 | 1/2017 | Cirit et al. | |
| 9,590,706 B1 | 3/2017 | Frank | |
| 9,590,708 B1 | 3/2017 | Frank | |
| 9,614,557 B1 | 4/2017 | Mayer et al. | |
| 9,634,736 B2 | 4/2017 | Mukherjee et al. | |
| 9,685,923 B2 | 6/2017 | Candage et al. | |
| 9,741,677 B1 | 8/2017 | Strutz et al. | |
| 9,768,978 B2 | 9/2017 | Coenen et al. | |
| 9,817,078 B2 | 11/2017 | Pepka et al. | |
| 9,941,999 B1 | 4/2018 | Milesi et al. | |
| 10,074,713 B1 | 9/2018 | Briano | |
| 10,074,939 B1 | 9/2018 | Briano | |
| 10,097,338 B1 * | 10/2018 | Ng | H04B 15/04 |
| 10,142,052 B2 | 11/2018 | Milesi et al. | |
| 10,236,932 B1 * | 3/2019 | Briano | G01R 33/09 |
| 10,281,946 B1 * | 5/2019 | Baranwal | H03F 3/16 |
| 10,290,608 B2 | 5/2019 | Latham et al. | |
| 10,436,606 B2 | 10/2019 | Kerdraon et al. | |
| 10,622,549 B2 | 4/2020 | Chetlur et al. | |
| 2002/0135236 A1 | 9/2002 | Haigh et al. | |
| 2003/0042571 A1 | 3/2003 | Chen et al. | |
| 2004/0189271 A1 | 9/2004 | Hansson et al. | |
| 2005/0185640 A1 | 8/2005 | Adam et al. | |
| 2006/0117232 A1 | 6/2006 | Warren, Jr. et al. | |
| 2007/0252247 A1 | 11/2007 | Kim et al. | |
| 2008/0025450 A1 | 1/2008 | Alfano et al. | |
| 2008/0031286 A1 | 2/2008 | Alfano et al. | |
| 2008/0136442 A1 | 6/2008 | Chen | |
| 2008/0267301 A1 | 10/2008 | Alfano et al. | |
| 2008/0299904 A1 | 12/2008 | Yi et al. | |
| 2008/0311862 A1 | 12/2008 | Spina et al. | |
| 2009/0069801 A1 | 3/2009 | Jensen et al. | |
| 2010/0245052 A1 | 9/2010 | Kitayoshi | |
| 2010/0250820 A1 | 9/2010 | Gaalaas et al. | |
| 2010/0259909 A1 | 10/2010 | Ho et al. | |
| 2010/0329364 A1 | 12/2010 | Giombanco et al. | |
| 2011/0204460 A1 | 8/2011 | Wong et al. | |
| 2011/0298116 A1 | 12/2011 | Mizusaki et al. | |
| 2011/0298527 A1 * | 12/2011 | Lloyd | H03K 17/18 327/478 |
| 2012/0002377 A1 | 1/2012 | French et al. | |
| 2012/0168901 A1 | 7/2012 | Santangelo et al. | |
| 2013/0020660 A1 | 1/2013 | Milano et al. | |
| 2013/0179818 A1 | 7/2013 | Wang et al. | |
| 2013/0242616 A1 | 9/2013 | Oldenkamp | |
| 2013/0264961 A1 * | 10/2013 | Chang | H05B 45/10 315/201 |
| 2013/0278438 A1 | 10/2013 | Mueck | |
| 2014/0266332 A1 | 9/2014 | Goswami | |
| 2014/0312923 A1 | 10/2014 | Alley | |
| 2014/0346887 A1 | 11/2014 | Bhamidipati et al. | |
| 2015/0004902 A1 | 1/2015 | Pigott et al. | |
| 2015/0103986 A1 | 4/2015 | Chen et al. | |
| 2015/0325501 A1 | 11/2015 | Sutton et al. | |
| 2016/0014829 A1 | 1/2016 | Hasegawa | |
| 2016/0087914 A1 * | 3/2016 | Goswami | H04B 5/0031 370/442 |
| 2016/0197560 A1 | 7/2016 | Leedham et al. | |
| 2016/0282388 A1 | 9/2016 | Milano et al. | |
| 2017/0012622 A1 | 1/2017 | Peter et al. | |
| 2017/0030980 A1 | 2/2017 | Kosier et al. | |
| 2017/0187200 A1 | 6/2017 | Somerville et al. | |
| 2017/0237420 A1 * | 8/2017 | Lindemann | H04L 12/10 332/107 |
| 2017/0285117 A1 | 10/2017 | Drouin et al. | |
| 2018/0041200 A1 * | 2/2018 | Lynch | H03K 5/1252 |
| 2018/0076176 A1 | 3/2018 | Latham et al. | |
| 2018/0109246 A1 * | 4/2018 | Zaplana | H03K 3/017 |
| 2019/0238181 A1 * | 8/2019 | Tanghe | H04B 3/50 |
| 2020/0036373 A1 * | 1/2020 | Evans | H03K 17/04206 |
| 2020/0076416 A1 * | 3/2020 | Bang | H03K 17/08122 |
| 2020/0076425 A1 * | 3/2020 | Garg | H03K 17/693 |
| 2020/0169299 A1 | 5/2020 | Latham et al. | |

FOREIGN PATENT DOCUMENTS

| | | |
|---|---|---|
| GB | 2173956 | 10/1986 |
| JP | S 57123460 A | 7/1982 |
| JP | H 0744515 B2 | 5/1995 |
| JP | 2000-174666 | 6/2000 |
| WO | WO 98/37672 | 8/1998 |
| WO | WO 99/21332 | 4/1999 |
| WO | WO 99/22307 | 5/1999 |
| WO | WO 03/050376 A2 | 6/2003 |

OTHER PUBLICATIONS

U.S. Appl. No. 16/539,405, filed Aug. 13, 2019, Briano.
U.S. Non-Final Office Action dated Oct. 9, 2018 for U.S. Appl. No. 15/801,679; 15 Pages.
Response to U.S. Non-Final Office Action dated Oct. 9, 2018 for U.S. Appl. No. 15/801,679; Response filed Nov. 15, 2018; 8 Pages.
U.S. Notice of Allowance dated Dec. 14, 2018 for U.S. Appl. No. 15/801,679; 8 Pages.
U.S. Appl. No. 15/363,285, filed Nov. 29, 2016, Milano et al.
U.S. Appl. No. 15/653,820, filed Jul. 19, 2017, Latham.
Cantrell et al., "Maximizing Performance and Integration in Application Requiring Isolated SPI;" Technical Article from Analog Devices; Downloaded on Jul. 21, 2017 from www.analog.com; 4 Pages.
Jim Daughton: "Spin-Dependent Sensors", Proceedings of the IEEE, vol. 91, No. 5; May 2003; pp. 681-686; 6 Pages.

(56) References Cited

OTHER PUBLICATIONS

Texas Instruments, "ISO7842x High-Performance, 8000-$V_{PK}$ Reinforced Quad-Channel Digital Isolator;" ISO7842, ISO7842F; SLLSEJOG Oct. 2014; Revised Mar. 2017; Downloaded on Jul. 21, 2017 from www.ti.com; 38 Pages.
Extended European Search Report dated Jan. 16, 2018 corresponding to European Application No. 17190972.4; 6 Pages.
Response (with Amended Claims) to Extended European Search Report dated Jan. 16, 2018 for European Application No. 17190972.4; Response filed Sep. 4, 2018; 12 Pages.
European Examination Report dated Nov. 28, 2019 for European Application No. 17190972.4; 5 Pages.
Response (with Amended Claims) to European Examination Report dated Nov. 28, 2019 for European Application No. 17190972.4; Response filed Jan. 27, 2020; 10 Pages.
Extended European Search Report dated Jan. 15, 2018 corresponding to European Application No. 17190974.0; 6 Pages.
Response (with Amended Claims) to Extended European Search Report dated Jan. 15, 2018 for European Application No. 17190974.0; Response filed Sep. 3, 2018; 13 Pages.
European Decision to Grant dated Jan. 31, 2019 for European Application No. 17190974.0; 2 Pages.
Non-Final Office Action dated Dec. 12, 2018 for U.S. Appl. No. 15/702,940; 7 Pages.
Response to Non-Final Office Action dated Dec. 12, 2018 for U.S. Appl. No. 15/702,940, filed Dec. 21, 2018; 7 Pages.
U.S. Notice of Allowance dated Mar. 18, 2019 for U.S. Appl. No. 15/702,940; 11 Pages.
U.S. Non-Final Office Action dated Jul. 17, 2017 for U.S. Appl. No. 15/453,034; 7 Pages.
Response to U.S. Non-Final Office Action dated Jul. 17, 2017 for U.S. Appl. No. 15/453,034; Response Filed Sep. 22, 2017; 8 Pages.
U.S. Non-Final Office Action dated Jan. 11, 2018 for U.S. Appl. No. 15/453,034; 14 Pages.
Response to U.S. Non-Final Office Action dated Jan. 11, 2018 for U.S. Appl. No. 15/453,034; Response Filed Jan. 22, 2018; 8 Pages
U.S. Notice of Allowance dated Feb. 14, 2018 for U.S. Appl. No. 15/453,034; 12 Pages.
PCT International Search Report and Written Opinion dated Apr. 6, 2018 for International Application No. PCT/US2018/015133; 15 Pages.
PCT International Preliminary Report dated Sep. 19, 2019 for International Application No. PCT/US2018/015133; 10 Pages.
European Rules 161/162 Communication dated Oct. 17, 2019 for European Application No. 18706886.1; 3 Pages.
U.S. Non-Final Office Action dated May 1, 2018 for U.S. Appl. No. 15/909,178; 12 Pages.
Response to U.S. Non-Final Office Action dated May 1, 2018 for U.S. Appl. No. 15/909,178; Response filed Aug. 1, 2018; 20 Pages.
U.S. Notice of Allowance dated Sep. 26, 2018 for U.S. Appl. No. 15/909,178; 22 Pages.

\* cited by examiner

SIGNAL ISOLATOR WITH THREE STATE DATA TRANSMISSION

CROSS REFERENCE TO RELATED APPLICATIONS

The present application claims the benefit of U.S. Provisional Patent Application No. 62/901,491, filed on Sep. 17, 2019, which is incorporated herein by reference.

BACKGROUND

As is known in the art, signal isolators can be used to transfer signals (e.g., digital and/or analog signals) between circuits or systems operating in different voltage domains. As is also known in the art, signal isolators can be used in a variety of applications. In hybrid electric vehicle (HEV) applications, for example, signal isolators can be used to transfer signals between higher voltage systems and lower voltage systems of a HEV for controlling operation of the HEV. As one example, battery measurement signals may be transferred between battery packs of the HEV operating in a first voltage domain (e.g., voltages greater than about 100V) and battery management systems of the HEV operating in a second voltage domain (e.g., voltages less than about 10V) that is different from the first voltage domain for controlling charging and discharging of the battery packs. The battery packs can be used to drive an electric motor and other components of the HEV. Digital isolators generally provide an on or off output to indicate a logical '1' or a logical '0' for a signal. In conventional isolators, a fault or any type of diagnostics is not conveyed with this on/off configuration.

SUMMARY

Described herein are concepts, systems, circuits and techniques related to a digital signal isolator. The digital signal isolator is capable of transmitting three states of data across an isolation barrier and of outputting at least three different states at an output of the digital isolator.

In accordance with an embodiment, the digital signal isolator integrated circuit package includes a first circuit having a first input and a first output, a second circuit having a second input and a second output, an isolation barrier layer between the first circuit and the second circuit, wherein the second output of the second circuit is coupled to the first input of the first circuit through the isolation barrier, and a comparison circuit configured to compare the first input of the first circuit to the second output of the second circuit.

The signal isolator can include one or more of the following features alone or in combination. The comparison circuit can include a comparator. The second output can be configured to convey at least three states, including a first state indicative of a logical high of an input signal received at the first input, a second state indicative of a logical low of the input signal, and a third state indicative of a fault condition. The second output can be configured to convey at least three symbols, including a first symbol indicative of a logical high of an input signal received at the first input, a second symbol indicative of a logical low of the input signal, and a third symbol indicative of a parameter of the input signal. The parameter of the input signal can be at least one of: a clock signal corresponding to the input signal, a fault signal indicative of no input signal, or an error signal indicating that the first input does not equal the second input. The signal isolator can include a receiver feedback element between the second output and the comparison circuit can be configured to identify a null condition to trigger the third state. The logical high can be provided as a first amplitude and the logical low can be provided as a second amplitude, different than the first amplitude, and the third state can include a third amplitude, different than the first amplitude and the second amplitude. The third amplitude can be zero. The logical high can be provided as a first pulse width and the logical low can be provided as a second pulse width, different than the first pulse width, and the third state can be no output (zero). The logical high can be provided as a first pulse height and the logical low can be provided as a second pulse height, different than the first pulse height, and the third state can be no output (zero) indicative of a fault condition. The first output can be further configured to convey at least a fourth state indicative of a second condition, different than the fault condition, that is indicative of a specific condition of the signal or of the signal isolator. The fourth state can be conveyed as a fourth amplitude, different than the first amplitude, different than the second amplitude, and different than the third amplitude. The signal isolator can further include a timer coupled to the comparison circuit configured to sample the output of the comparison circuit at a specific time. The first circuit and the second circuit are on a same die. The first circuit can be disposed on a first die and the second circuit can be disposed on a second die, different from the first die. The first circuit can include a third input and a third output, and the second circuit can include a fourth input and a fourth output, and the first circuit can include a second comparison circuit configured to compare the third input of the first circuit to the fourth output of the second circuit. The second circuit can include a third input and a third output, and the first circuit can include a fourth input and a fourth output, and the second circuit can include a second comparison circuit that can be configured to compare the third input of the second circuit to the fourth output of the first circuit. The signal isolator can further include a status output that can be configured to convey a fault in at least one of the first circuit or the second circuit.

A method implementing a signal isolator having a first circuit separated from a second circuit by an isolation barrier layer, includes receiving an input signal at an input of the first circuit of the signal isolator, the input having a logical high or a logical low value, and providing an output signal at an output of the second circuit as at least one of three states. According to the method, a first state can be indicative of the logical high of the input signal, a second state can be indicative of the logical low of the input signal, and a third state can be indicative of a first condition.

The method can include one or more of the following features alone or in combination. In the method, the first state can be indicated by a first amplitude, the second state can be indicated by a second amplitude, and the third state can be indicated by a third amplitude. The third amplitude can be zero. The output signal can further include a fourth state indicated by a fourth amplitude, indicative of a specific condition, different than the first condition. The method can further include comparing the output of the second die to the input of the first die to provide a compared output. The method can further include sampling the compared output when timer times out. The method can further include embedding clock data within the output, such that the third state provides the clock signal as the first condition of the signal isolator. In the method, the first state can be indicated by a first symbol, the second state can be indicated by a second symbol that is different from the first symbol, and the third state can be indicated by a third symbol that is different from the first and second symbols.

A method implementing a signal isolator having a first circuit separated from a second circuit by an isolation barrier, the first circuit having a first input and a first output, the second circuit having a second input and a second output, the method includes receiving an input signal at the first input of the first circuit, sending an output signal at the second output of the second circuit back, across the isolation barrier, to a comparison circuit, comparing the output signal to the input signal by the comparison circuit, and providing an output as one of at least three states, wherein a first state is indicative of a logical high of the input signal, a second state is indicative of logical low of the input signal, and a third state indicative of a fault condition when the output signal is not equal to the input signal.

The method can further include setting a status bit on the signal indicator to indicate a fault of the signal isolator

BRIEF DESCRIPTION OF THE DRAWINGS

The foregoing features of the disclosure, as well as the disclosure itself may be more fully understood from the following detailed description of the drawings, in which.

DETAILED DESCRIPTION

Figure 1:
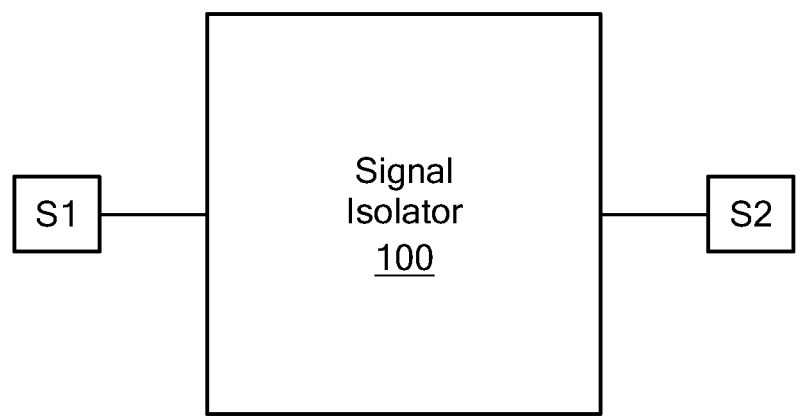
FIG. 1 is a block diagram of an example signal isolator coupled to systems that may communicate with each other.

Referring to FIG. 1, an example signal isolator 100 in accordance with an embodiment of the disclosure is shown coupled to a first system S1 and to a second system S2. In embodiments, the first system S1 is configured to operate in a first voltage domain (e.g., voltages greater than about 100V). Additionally, in embodiments, the second system S2 is configured to operate in a second voltage domain (e.g., voltages less than about 10V) that is different from the first voltage domain. The first and second voltage domains may include different source potentials and different grounds, for example.

In embodiments, the signal isolator 100 may provide a communication path between the first system S1 and the second system S2. In particular, the signal isolator 100 may receive signals from the first system S1 and provide the signals to the second system S2. Additionally, the signal isolator 100 may receive signals from the second system S2 and provide the signals to the first system S1. In embodiments, the signal isolator 100 may also be configured to provide signal isolation between the first system S1 and the second system S2 by preventing transference of voltages from one domain to the other and protecting lower voltage circuitry of the first system S1 or the second system S2 from higher voltage signals which can damage the lower voltage circuitry, for example.

Figure 2:
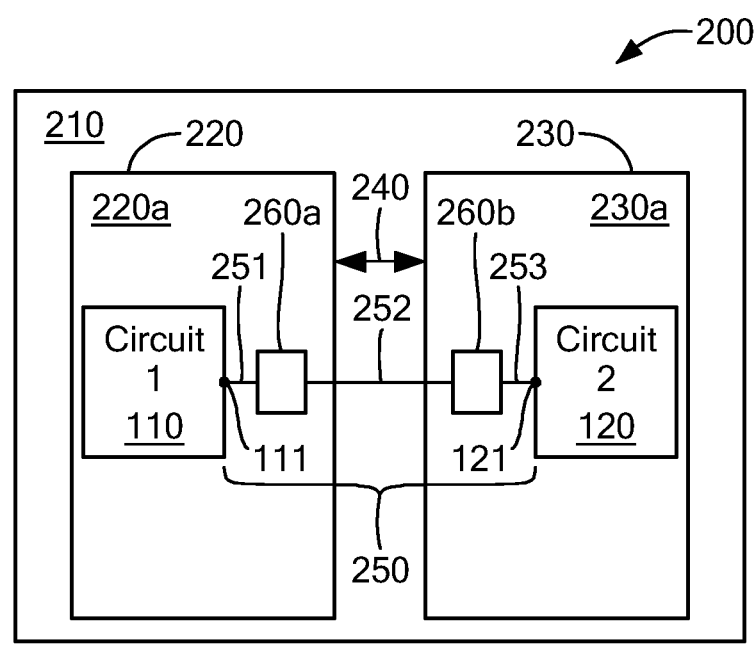
FIG. 2 is a block diagram of an example signal isolator integrated circuit (IC) package in accordance with embodiments of the disclosure.

Referring now to FIG. 2, an example signal isolator system 200 including a signal isolator integrated circuit (IC) package 210 is shown. The IC package 210 includes a first die 220 and a second die 230. The IC package 210 also includes a signal path 250 from the first die 220 to the second die 230. In the example embodiment shown, the signal path 250 includes a first electrical connection 251, a second electrical connection 252, a third electrical connection 253, an isolation barrier 260a, and an isolation barrier 260b. In some embodiments, the digital isolator could include only one of isolation barriers 260a, 260b, as will be appreciated. Additionally, in the example embodiment shown, the signal path 250 extends from the first die 220 to the second die 230 across a spacing 240 between the first and second die 220, 230. The spacing 240 corresponds to a predetermined distance or region between the first and second die 220, 230. In embodiments, the spacing 240 (in conjunction with isolation barrier 260a, 260b and/or other isolation means) provides galvanic isolation between the first and second die 220, 230. The isolation barrier 260a, 260b can be on one die (either isolation barrier 260a on the first die 220 or isolation barrier 260b on the second die 230) or on two die (including both isolation barrier 260a on the first die 220 and the isolation barrier 260b on the second die 230). If on two die the isolation barrier has two components in series with the insulation and the capability of being the combination of the isolation barriers on both die with the isolation barrier referring generally to the barrier provided by both 260a and

260b. It is understood that any suitable technique can be used to provide galvanic isolation between the first and second die 220, 230.

In the illustrated embodiment, the isolation barrier 260a, 260b and a first circuit 110 (e.g., a first transmitter/receiver circuit) are each supported by a respective surface 220a (e.g., an active surface) of the first die 220. Additionally, a second circuit 120 (e.g., a second transmitter/receiver circuit) is supported by a respective surface 230a (e.g., an active surface) of the second die 230. A terminal 111 (e.g., an input/output (I/O) terminal) of the first circuit 110 is coupled to the isolation barrier 260a through first electrical connection 251 of the signal path 250. Additionally, a terminal 121 (e.g., an I/O terminal) of the second circuit 120 is coupled to the isolation barrier 260a through third electrical connection 253 of the signal path 250. Isolation barrier 260a may be coupled to isolation barrier 260b through second electrical connection 252.

In embodiments, the first circuit 110 and the first die 220 operate in a first voltage domain and the second circuit 120 and the second die 230 operate in a second voltage domain that is substantially different from the first voltage domain. Additionally, in embodiments separate voltage supply signals and ground connections can be provided to each of the first and second dies 220, 230 of the IC package 210 to support the respective first and second voltage domains from which the first and second circuits 110, 120, and the first and second die 220, 230, may operate in. For example, in embodiments the first die 220 is coupled to a first supply voltage in the first voltage domain and the second die 230 is coupled to a second supply voltage in the second voltage domain. In embodiments, a voltage differential between the first and second voltage domains can range from about zero volts to thousands of volts.

With the above-described arrangement of IC package 210, an output signal (e.g., a digital or analog signal) of the first circuit 110 can be received by the second circuit 120 with signal isolation via isolation barrier 260a, 260b. Additionally, with the above-described arrangement of IC package 210, an output signal of the second circuit 120 can be received by the first circuit 110 with signal isolation via isolation barrier 260a, 260b. In other words, the isolation barrier 260a, 260b may be used to pass signals between first and second voltage domains in which the first and second circuits 110, 120, and the first and second die 220, 230, may operate. The first circuit 110 may process signals received from the second circuit 120. Additionally, the second circuit 120 may process signals received from the first circuit 110.

In embodiments in which the IC package 210 is used for communication of digital signals and the first and second circuits 110, 120 operate in first and second respective voltage domains, for example, the isolation barrier 260a, 260b may be coupled to receive signals from the first circuit 110 having one of two binary voltage levels referenced to a ground voltage of the first voltage domain via electrical connection 251 of the signal path 250. Additionally, the isolation barrier 260a, 260b may be configured to allow transfer of signals to the second circuit 120 via electrical connection 252 of the signal path 250, with the second circuit 120 referencing the received signals to a ground voltage of the second voltage domain. In embodiments, the isolation barrier 260a, 260b, which corresponds to an isolation barrier according to the disclosure, may transfer the signals using capacitive coupling techniques, for example.

More detailed descriptions of isolation barriers according to the disclosure are discussed in connection with figures below. However, let it suffice here to say that isolation barriers according to the disclosure (e.g., 360, shown in FIG. 3, as will be discussed) include a plurality of isolation layers which are stacked substantially vertically, perpendicular to a surface (e.g., an active surface) of the die(s) on which the isolations barriers are supported. In the illustrated embodiment, for example, isolation barrier 260a, 260b may include a plurality of isolation layers which are disposed over and stacked on surface 220a of first die 220.

It is understood that a wide range of signal types can be transmitted between the first die 220 and the second die 230 via isolation barrier 260a, 260b without departing from the scope of the disclosure. Additionally, it is understood that a wide range of techniques can be used for transmitting signals between the first die 220 and the second die 230 via isolation barrier 260a, 260b without departing from the scope of the disclosure. In embodiments, signals may be transferred between the first die 220 and the second die 230 using on-off keying techniques, for example.

It is also understood that while the second circuit 120 is shown as supported by a different die from the first circuit 110 in the illustrated embodiment, in embodiments the second circuit 120 may be supported by a same die as the first circuit 110, as will be described further below in connection with FIG. 6, for example. In embodiments, at least one of the first and second die 220, 230 can support diagnostic circuitry which may be used to determine if signals are transferring correctly between the first and second circuits 110, 120. It is understood that any practical number of circuits can be formed on the first and/or second die 220, 230 to meet the needs of a particular application.

More detailed aspects of signal isolators, with a particular focus on data transmission across the isolation barrier according to the disclosure, are described in connection with figures below. The digital isolator described herein provides three-state data transmission across the isolation barrier that enables the receiver to be able to distinguish between a logic 1 (which may be referred to herein as "high"), a logic 0 (which may be referred to herein as "low"), and a fault or error of the digital isolator, such as failure to transmit a signal. For example, digital isolators having only two states of data transmission across the isolation barrier may not be able to determine when a fault or error has occurred. In embodiments, received signals are looped back to the transmitter side from the receiver side, according to the present disclosure, to verify that the input matches the output. Thus, signal integrity is ensured by verifying that the signal sent at the output matches the signal that is looped back. If any error in data transmission or loopback occurs as determined by a difference between the transmitted and the looped back signal, then the error is flagged for communication to circuitry separate from the isolated data channel. The error can be the result of no data transmission or a discrepancy in logic states and can be communicated by the digital isolator.

Figure 3:
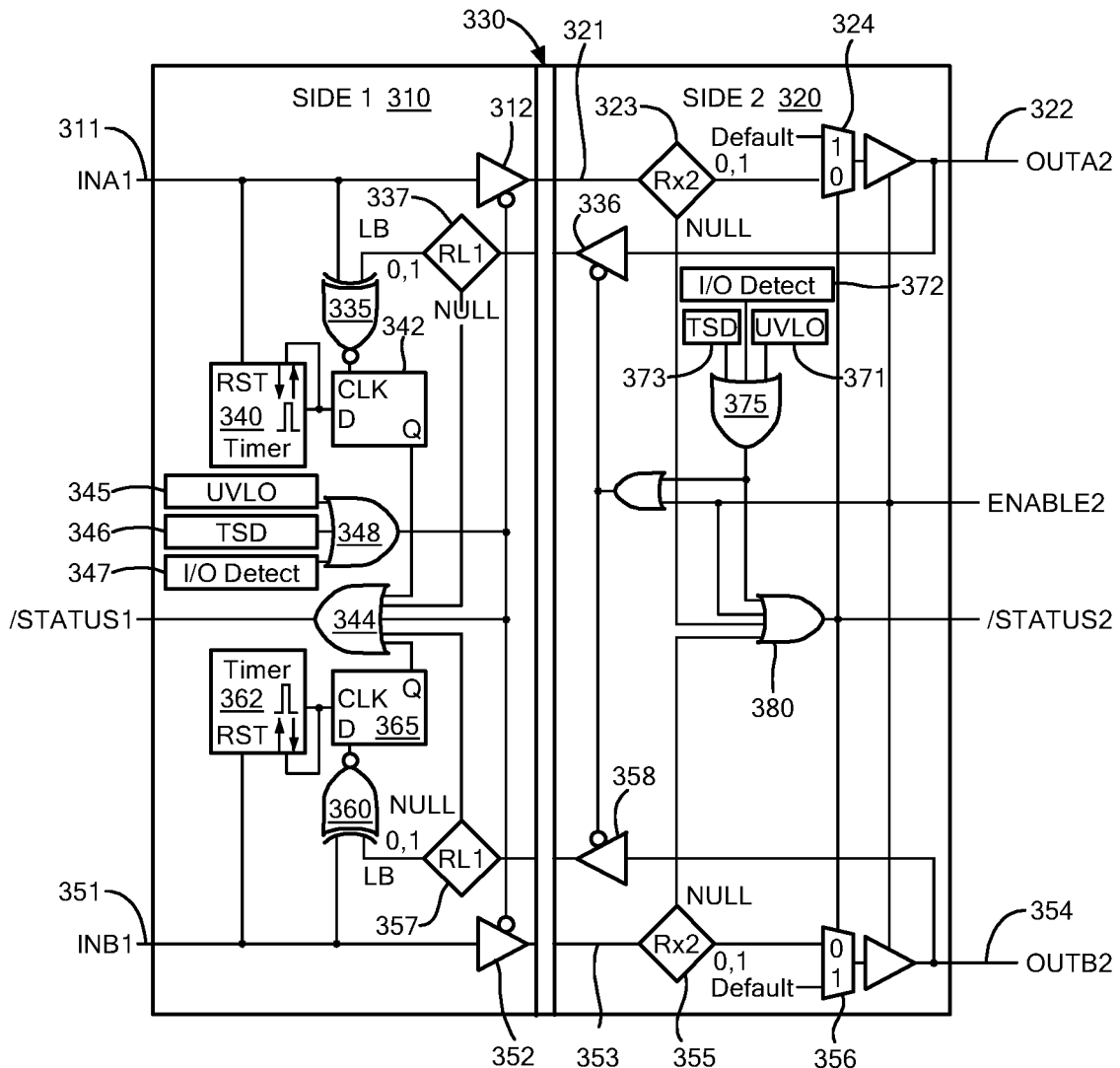
FIG. 3 shows a schematic block diagram of a digital signal isolator having two channels in the same direction, according to the present disclosure.

Referring now to FIG. 3, a schematic block diagram of a digital signal isolator having two channels in the same direction (i.e. both channels are transmitting on the same side and receiving on the same side of the isolation barrier), according to the present disclosure is shown. The digital signal isolator includes a first circuit 310, which may be referred to as a first "side" of the digital isolator, and a second circuit 320, which may be referred to as a second "side" of the digital isolator. An isolation barrier 330 is positioned between the first circuit 310 and the second circuit 320. According to the present disclosure, the signals received on the second side from the first side are looped back to the first side and compared to verify that the input INA1 matches the output OUTA2. If the input INA1 does not match the output OUTA2, then the STATUS1 signal or the STATUS2 signal can indicate an error in transmission from the first side 310 to the second side 320. The STATUS1 signal and STATUS2 signal allow for an indication of an error or fault on either side 310 or 320 of the digital signal isolator.

The first circuit 310 has a first input 311 and a first output 312, with the first input 311 configured to receive an input signal INA1. The input signal INA1 may be a digital square wave. The first output 312 is coupled across the isolation barrier 330 to a second input 321 of the second circuit 320 and through a receiver element 323 to the second output 322. In embodiments, a buffer element 312 for the input signal INA1 can be enabled in the absence of an error signal from the OR gate 348, as described below. The receiver (Rx2) element 323 is coupled to receive the second input 321 of the second circuit 320. The second output 322 provides an output signal OUTA2 that is coupled back across the isolation barrier 330 to a receiver loopback (RL1) element 337. The receiver element 323 is coupled to receive the three-state data transmission at the second input 321 of the second circuit 320, which as described herein can be a first amplitude for the logic 1, a second amplitude for logic 0, and no amplitude for a NULL value (which can be the absence of a loopback signal, the absence of a transmission signal, or the wrong value transmitted on the output side). Likewise, the three-state data transmission can be a first (highest) amplitude for a logic 1, a second (middle) amplitude for logic 0, and a third (lowest) amplitude for a NULL value.

The receiver element 323 transmits a 0 or 1 to the output 322 which can be provided as output signal OUTA2. A NULL detected by the receiver element 323 is conveyed to the OR gate 380 to set the STATUS2 signal, thereby indicating a fault if there is no signal received. The STATUS2 signal can be a one-bit digital signal where 0 represents no fault and 1 represents a fault or any other indication on the STATUS2 of fault or no fault. The second output 322 of the second circuit 320 and the first input 311 of the first circuit 310 are provided to a comparison circuit 335. As such, the signal received by the receiver element 323 is fed back, across the isolation barrier 330, as loopback (LB) signal to the receiver loopback element 337. The receiver loopback element 337 provides the logic 0 or logic 1 to the comparison circuit 335 for comparison to the input signal 311. The comparison circuit 335 may be an exclusive NOR (XNOR) gate or any appropriate circuit that performs a comparison of two input signals, such as a comparator. The receiver loopback element 337 outputs an active NULL signal if a logic 1 or 0 is not received which causes the STATUS1 signal to go active. When a default signal or other signal indicating an error is received at element 324, the digital isolator is configured to enter a "safe-state" or other third state of operation, and a third state (e.g., third amplitude, such as zero) is output by the OUTA2 output 230 of the digital isolator.

In the illustrated embodiment, when using the comparison circuit 335, the output goes high when the input signal INA1 at the input 311 does not match the output signal OUTA2 at output 322. Thus, the output of the comparator 335 will be low as long as the input (INA1) matches the loopback LB signal, however the output of comparator 335 will be high when the input INA1 does not match the loopback LB signal provided by the receiver loopback element 337. Thus, a high output of the comparison circuit 335 will cause STATUS1 to be set to high, which is thereby used to indicate a fault or error of the isolator. Although a XNOR gate is shown for the comparison circuit 335, it will be appreciated that any comparator or any circuit that performs a comparison of two incoming signals can be implemented.

The comparison circuit 335 is coupled to a D flip-flop 342 which is coupled to a timer 340. The output of the comparison circuit 335 is sampled by the D flip-flop 342 when the timer 340 times out. The timer 340 may be referred to herein as a "watchdog" or more generally "WD" timer. In example embodiments, the timer 340 has a duration that is at least two times greater than a propagation delay of an input signal INA1 received at the first input 311 of the first circuit 310 to sample the comparison circuit 335 at a specific time. Due to the propagation delay that exists between the input data INA1 transmitted and the loop back LB signal being received, the timer ensures that the flip-flop 342 samples the output of the comparison circuit 335 at the proper time. It will be appreciated that if the input data changes states in a time shorter than the round trip propagation delay (in other words, if the input data changes state quicker than the timer times out), an accurate comparison of the input to the loop back signal cannot be performed. Even though an accurate comparison between the input and output cannot be made, the fact that the LB signal is changing is an indication that the second side 320 is operational and the status does not change state because the comparison circuit 335 is not sampled.

If the receiver loopback (RL1) elements 337, 357 detect a signal that is not a logic 1 or 0, the active NULL output to the OR gate 344 sets the STATUS1 signal to high, to thereby indicate a fault. Likewise, if the receiver element 323 or receiver element 355 make the NULL output active the STATUS2 signal becomes active.

An input for OR gate 344 for the STATUS1 output signal is provided by an output of OR gate 348 in which any error detected by UVLO 345, TSD 346, or I/O Detect 347 causes the STATUS1 to be set to high indicating an error on side 1 and disables the TX 312 and 352 indicating an error on side 2 causes the STATUS2 to be set high. The UVLO 345 is undervoltage lockout—after turning on power, UVLO keeps the internal circuits in standby state until the input voltage reaches a desired UVLO target or "released" voltage, to avoid malfunctioning of the product below the UVLO voltage. If the input voltage drops below the UVLO target voltage during operation, the UVLO function forces the part into standby state to prevent a malfunction. When the input voltage rises above the UVLO again, the UVLO returns to normal operation. The thermal shutdown (TSD) 346 can be tied to a sensor, such as a temperature sensor, to disable the part of the temperature exceeds a certain threshold value. The I/O Detect 347 allows the microcontroller to detect the logic states of the data transmission. If the logic states are not able to be detected, a high output can be used to indicate a fault of the part.

The digital signal isolator includes a second channel having a third input 351 that receives a second input signal INB1 on the first circuit 310, a third output 352 on the first circuit 310, a fourth input 353 on the second circuit 320 that is coupled to the third output 352 of the first circuit 310, and a fourth output 354 coupled to the fourth input 353 via the receiver element 355. The fourth output 354 of the second circuit 320 is looped back to a receiver loopback element 357. The receiver loopback element 357 is coupled between the fourth output 354 and a second comparison circuit 360 to identify a null condition and the STATUS will go high. The null condition, for example, could be the absence of a loopback signal, the absence of a transmission signal, or the wrong value transmitted on the output side. The comparison circuit 360 is configured to compare the input signal at the first input 351 to the loopback signal LB output by the receiver loopback element 357. The output of the comparison circuit 360 is sampled by the D flip-flop 365 when the timer 362 times out. The timer 362 is coupled to the comparison circuit 360 and has a duration that is at least two times greater than a propagation delay of an input signal received at the third input of the first circuit to sample the comparator 360 at a specific time. In some instances, the timer disclosed herein can have a propagation delay that is greater than two times the propagation delay, such that it is two times the duration and some additional time, to account for other factors as appropriate. It will be appreciated that if the input data changes states in a time shorter than the round trip propagation delay (in other words, if the input data changes state quicker than the timer times out), an accurate comparison of the input to the loop back signal cannot be performed. Even though an accurate comparison between input and output cannot be made, the fact that the LB signal is changing is an indication that the side 2 320 is operational and the status does not change state because the comparison circuit 335 is not sampled. The comparison circuit 360 can be any appropriate circuit that performs a comparison of two input signals to determine if they are the same or different, such as a comparator or an XNOR gate.

The OR gate 380 generating the STATUS2 bit has an input as the output of the OR gate 375 in which any error detected by UVLO 371, I/O Detect 372, or TSD 373 causes the STATUS2 to be set to high indicating an error on side 2 and disables the transmission (TX) buffers 336, 358 indicating an error on the first side 310 causes the STATUS1 to be set high.

It will be appreciated that the STATUS1 bit provides an indication of any of several errors, including a NULL value on the receiver loopback element 337 or 357 due to disable TX buffers 336, 358 on the second side 320, an error from any of the UVLO 345, TSD 346, I/O Detect 347, or from the comparator 335 itself due to the input not matching the output. The STATUS2 bit likewise provides an indication of any of several errors, including a NULL value on the receiver element 323 or 355, an error from any of the UVLO 371, I/O Detect 372, or TSD 373. However, the STATUS2 bit does not provide an indication if the input does not match the output, due to the STATUS2 bit not being influenced by the comparator 335 or the comparator 360.

Figure 5:
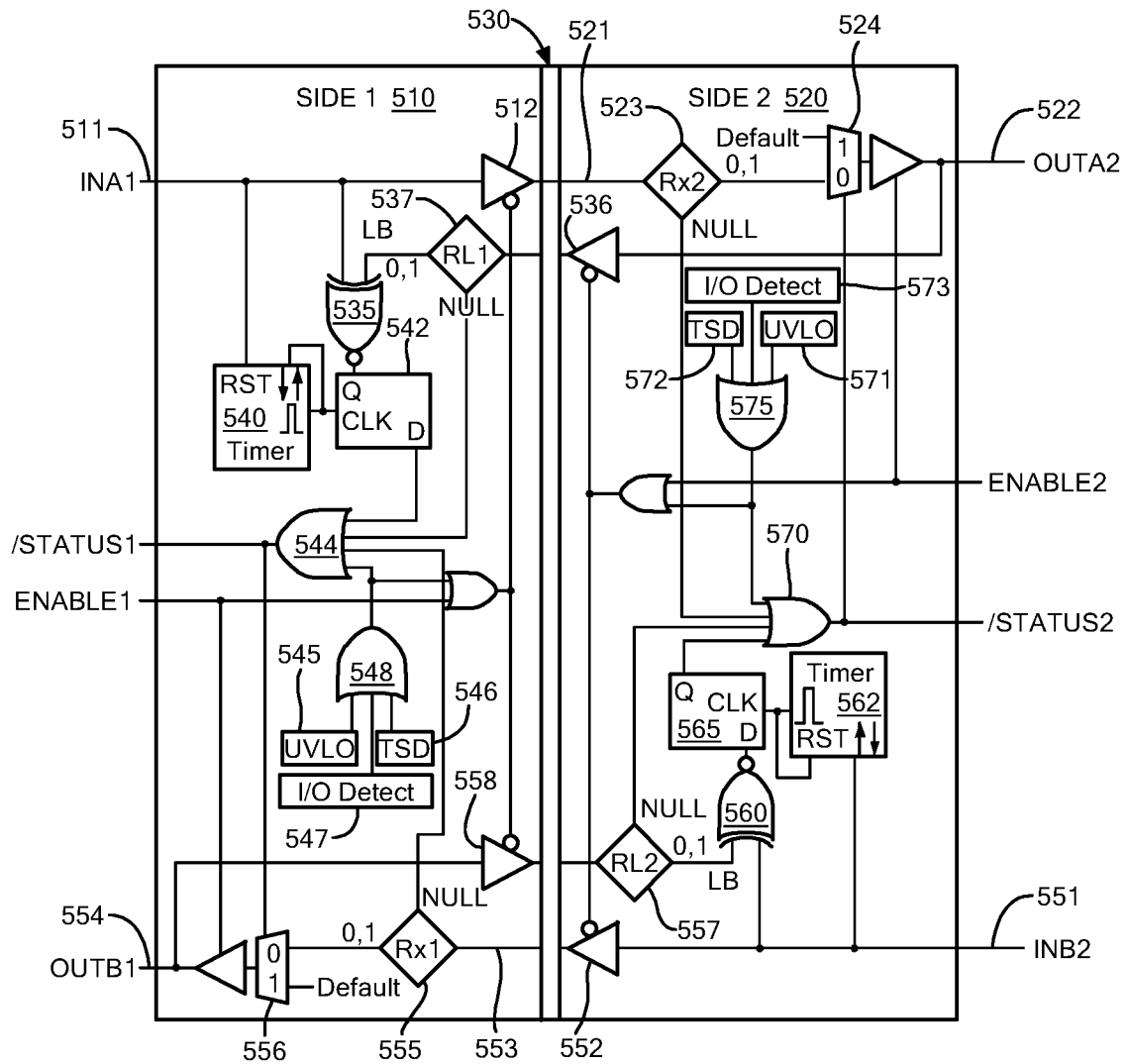
FIG. 5 shows a schematic block diagram of a digital signal isolator having two channels, one in one direction and the other in another direction.

Although FIG. 3 shows two channels, both flowing in a same direction (i.e., having inputs on the same side and output on the same side of the isolation barrier, which may be referred to as a "2/0" configuration), it will be appreciated that the techniques of the present disclosure are likewise applicable to any number of channels flowing in any number of directions. Likewise, the techniques are applicable to only a single channel flowing in a single direction across an isolation barrier. Refer, for example, to FIG. 5 showing a dual-channel configuration in which one channel is flowing in one direction and the other channel is flowing in the opposite direction across the isolation barrier, which may be referred to as a "1/1" configuration.

Figure 3A:
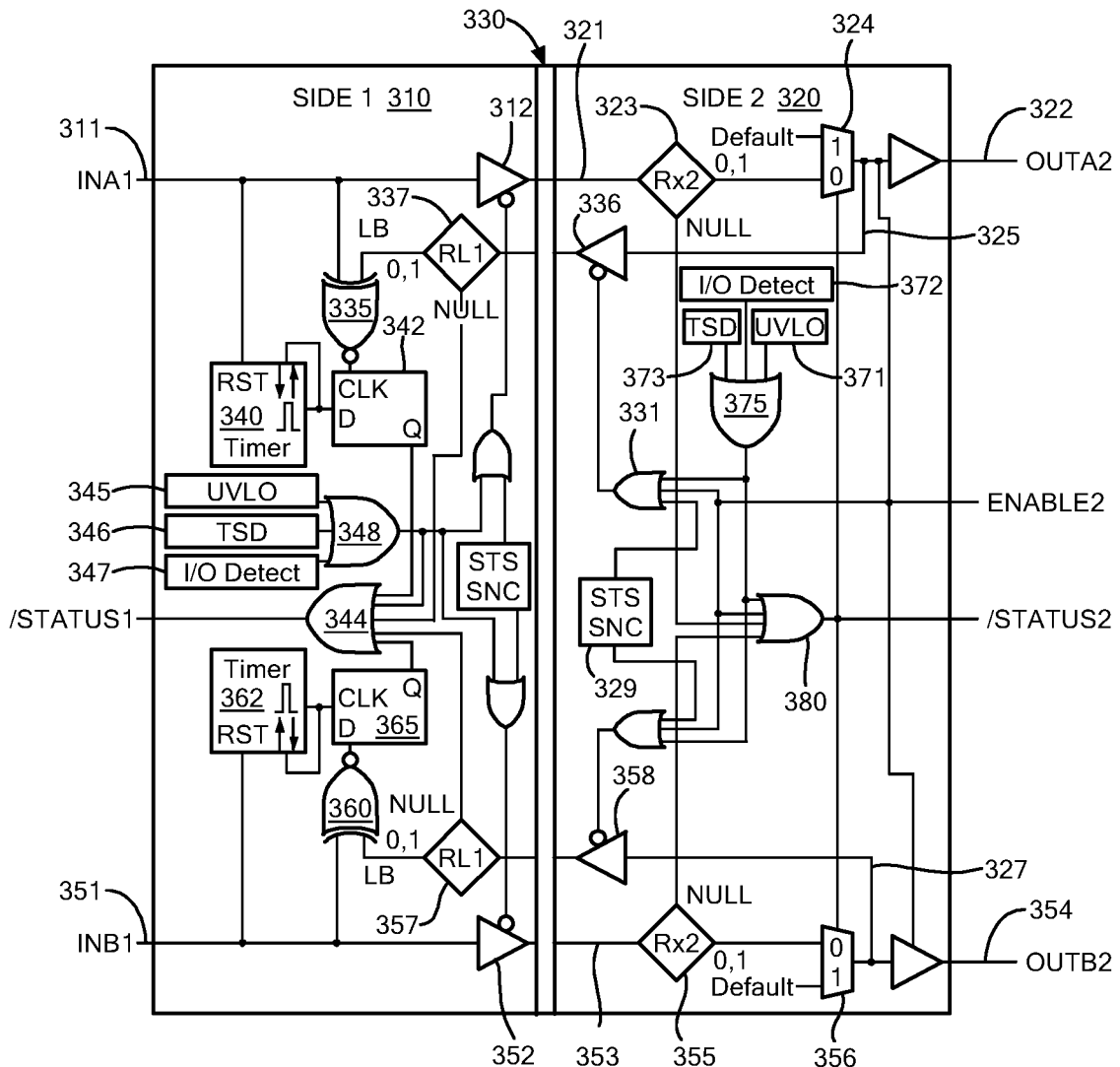
FIG. 3A shows a schematic block diagram of another embodiment of a digital signal isolator having two channels in the same direction, according to the present disclosure.

FIG. 3A shows another embodiment having some commonality with the isolator embodiment of FIG. 3 in which like reference numbers indicate like elements. In the isolator shown in FIG. 3A, the loop back check occurs prior to the final output so that loop back is prior to the control of the safe state ON output. Therefore, when a fault occurs the safe state will not interfere with the loop back. In addition, if the fault goes away the part can recover.

In the example embodiment, the output 325 from element 324 is fed back to the comparison circuit 335 via the buffer 336 and the receiver loopback (RL1) element 337. In this arrangement, the signal 325 is fed back prior to the output 322 (OUTA2) of the IC. Similarly, the output 327 from element 356 prior to output 354 (OUTB2) is fed back to the comparison circuit 360 for the other channel.

In the illustrated embodiment, a status [WHAT IS SNC?] module 329 outputs a first signal that is an input to the OR gate 331 the output of which enables the buffer 336. The status module 329 controls the channels during a fault where the status signals are synchronized on both sides of the isolation barrier. When the output is compared to the input, there is a test of the entire transmission path. The loop back sends the output state back to the input and logic ensures the output state equals the input state, as described above. When the output does not equal the input, the status pin is activated to indicate a fault. When this occurs, it is desirable to have both sides of the isolation boundary alerted to the fault condition.

In example embodiments, when the input side status signal STATUS1 is activated (indicating a fault where output doesn't equal input) the other transmission channel is controlled (in a dual channel device with extra channels for loop back check) to intentionally send a faulty transmission, such as a DC condition. In one embodiment, the status module 529 recognizes the fault and sends a ONE to the input of the OR gate that enables buffer 552. This will be flagged by the logic on the output side of the boundary as the signal at the output of element 556 will not match the input signal 551 (INB2).

This enables synchronization of the status bits on both sides of the boundary. This may interrupt the transmission of the second channel even though that channel may not otherwise have a fault. In this configuration, the user is notified of a fault in either channel. In this configuration, the status bits on both sides of the isolation boundary can be synchronized. In embodiments, both outputs can to the safe state when the status is enabled. Since signal loop back is prior to the final output, the system can recover when the fault on the first channel goes away. When that occurs both channels go back to normal transmission mode.

Figure 4:
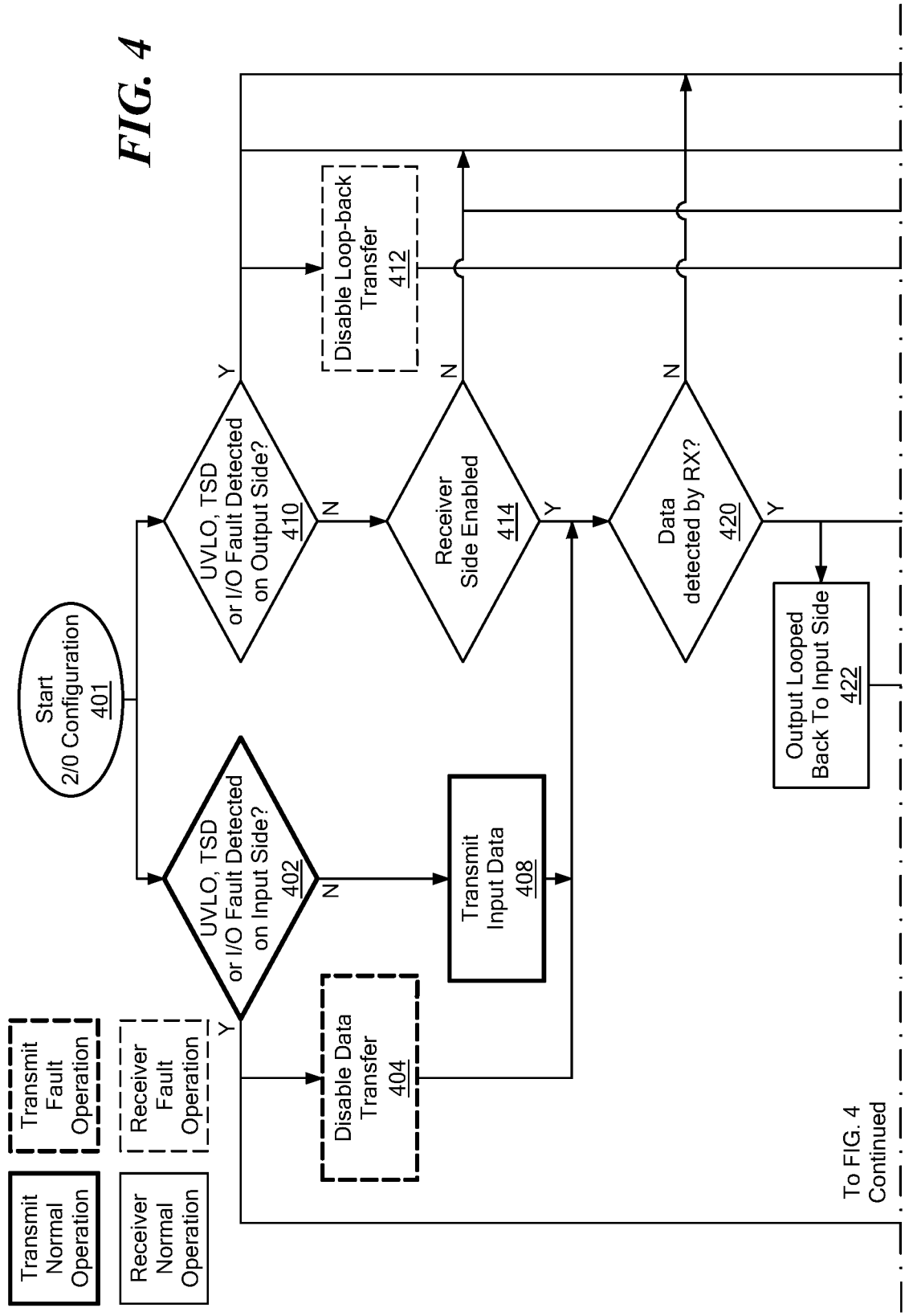
FIG. 4 is a flow chart of a method for implementing the digital signal isolator of FIG. 3.
Figure 4:
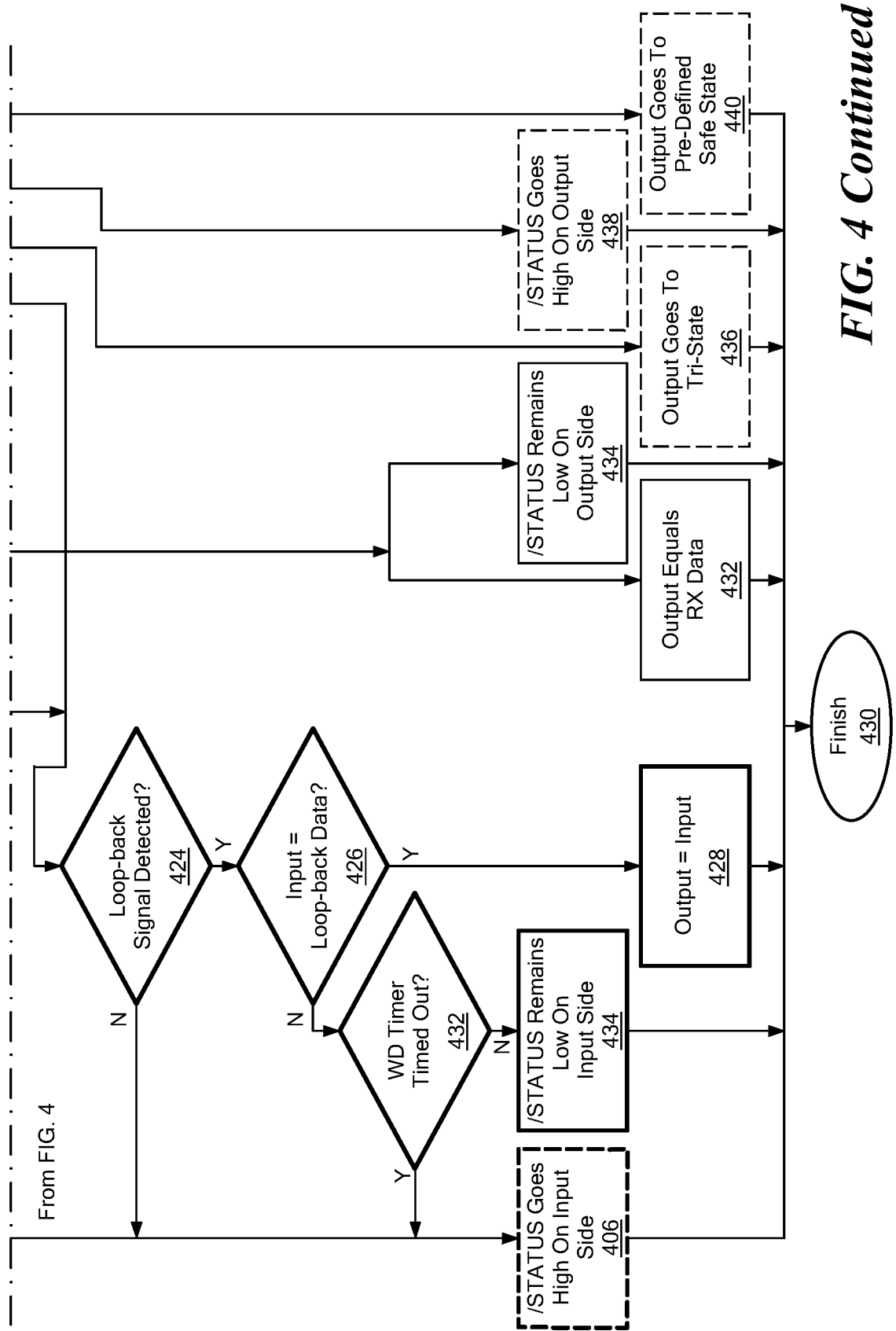

FIG. 4 is a flow chart of a method for implementing the digital signal isolator of FIG. 3. The method starts the dual-channel, same direction configuration at block 401, and advances to blocks 402 and 410, which may occur at the same time or substantially simultaneously. At block 402, a check is performed to verify if UVLO, TSD, or I/O Fault is detected on the input side. The input side may refer to the first side of the digital isolator, for example the first circuit 310 shown in FIG. 3. If yes there is a fault detected on the input side, then at block 404 data transfer is disabled due to a transmit fault operation. The STATUS bit for the input side goes high at block 406 to convey the fault. If there is no fault detected on the input side at block 402, the method continues to block 408 to transmit the input data and continues to block 420 to determine if data is detected by the receiver (e.g., receiver element 323 or receiver element 355 in FIG. 3).

At block 410, a check is performed to determine if a UVLO, TSD, or I/O Fault is detected on the output side. The output side may refer to the second side of the digital isolator, for example the first circuit 310 shown in FIG. 3. If yes there is a fault detected on the output side, then at block 412 the loopback transfer is disabled. If there is a fault detected on the output side, then at block 438 the STATUS for the output side goes high at block 438 and the output side goes to a pre-defined safe-state at block 440 (e.g., the third state of the digital isolator).

At block 410, if there is no fault detected on the output side, the method continues to determine if the receiver side is enabled at block 414. If the receiver side is not enabled at block 414, the method continues to block 436 and the output goes to the third state, the method also continues to block 438 to set the STATUS bit to high on the output side.

If the receiver side is enabled at block 414, the method continues to determine if data has been detected by the receiver (e.g., receiver element 323, 355) at block 420. If data is not detected by the receiver at block 420, then the STATUS it goes high on the output side at block 438 and the output goes to a pre-defined safe state at block 440. If data is detected by the receiver at block 420, then the method continues to output looped back to the input side at block 422. The output is set to the receiver data at block 432, and the STATUS remains low on the output side at block 434.

The method 400 then continues to block 424 to determine if the loopback signal is detected. If the loopback signal is detected at block 424, then at block 426 it is determined whether the input matches the loopback data (e.g., by comparator 335 or comparator 360 in FIG. 3). If the loopback signal is not detected at block 424, then the method advances to block 406, and the STATUS goes HI.

If the input matches the loopback data at block 426, then the output is the same as the input at block 428 and the procedures finishes at block 430. If the input does not match the loopback data at block 426, then the method continues to determine if the timer has timed out. If the input does not match and the timed has not timed out, then the status can remain low at block 434. If the input does not match the LB signal and the timer has timed out, then the status goes high on the input side at block 406.

FIG. 5 shows a schematic block diagram of a digital signal isolator having two channels, one in one direction and the other in another direction, according to the present disclosure. The digital signal isolator includes a first circuit 510, which may be referred to as a first "side" of the digital isolator, and a second circuit 520, which may be referred to as a second "side" of the digital isolator. An isolation barrier 530 is positioned between the first circuit 510 and the second circuit 520. According to the present disclosure, the signals received on the second side from the first side are looped back to the first side (and likewise, signals received on first side from second side are looped back to second side) and are compared to each other to verify that the input signal matches the output signal. The STATUS1 and STATUS2 signals allow for an indication of an error on either side 510 or 520f of the digital signal isolator.

The first circuit 510 has a first input 511 and a first output 512, with the first input 511 configured to receive an input signal INA1. The input signal INA1 may be a digital square wave. The first output 512 is coupled across the isolation barrier 530 to a second input 521 of the second circuit 520 and through the receiver element 523 to the second output 522. The receiver (Rx2) element 523 is coupled to receive the second input 521 of the second circuit 520. The output signal OUTA2 at the second output 522 is coupled back across the isolation barrier 530 to a receiver loopback (RL1) element 537, which may also be referred to as a receiver feedback element. The receiver element 523 is coupled to receive the three-state data transmission at the second input 521 of the second circuit 520, which as described herein can be a first amplitude for logic 1, a second amplitude for logic 0, and no amplitude for NULL. In some embodiments, the three-state data transmission can have three amplitudes with a first, highest amplitude for the logic 1, a second, middle amplitude for the logic 0, and a third, lowest amplitude for a NULL value. The receiver element 523 transmits the 0 or 1 to the output 522 as output signal OUTA2. A NULL detected by the receiver element 523 is conveyed to the OR gate 570 to set the STATUS2 signal, thereby indicating a fault if there is no signal received, and the output 522 goes to the safe-state or other third state of the digital isolator. The STATUS2 signal can be a one-bit digital signal where 0 is no fault and 1 is a fault. If the receiver 523 detects a signal, as such, the signal received by the receiver element 523 is fed back, across the isolation barrier 530, to the receiver loopback element 537 for comparison to the input signal by the comparison circuit 535, which may be an exclusive NOR (XNOR) gate.

The output of the comparison circuit 535 is sampled by the D flip-flop 542 when the timer 540 times out. The timer 540 is coupled to the comparison circuit 535 and has a duration that is at least two times greater than a propagation delay of an input signal INA1 received at the first input 511 of the first circuit 510 to sample the comparison circuit 535 at a specific time. Due to the propagation delay that exists between the input data INA1 transmitted and the loop back LB signal being received at comparison circuit 535, the timer ensures that the flip-flop 542 samples the comparison circuit 535 output at the proper time. It will be appreciated that if the input data changes states in a time shorter than the round trip propagation delay (in other words, if the input data changes state quicker than the timer times out), an accurate comparison of the input to the loop back signal cannot be performed, and thus error checking is performed to determine if data transmission occurring by detection of a logic 1 or a logic 0. Even though the accurate comparison between input and output cannot be made, the fact that the LB signal is changing is an indication that the side 2 520 is operational and the status does not change state because the comparison circuit 535 is not sampled.

The OR gate 544 for the STATUS1 is also tied to OR gate 548 in which any error detected by UVLO 545, TSD 546, or I/O Detect 547 causes the STATUS1 to be set to high, indicating an error.

The digital signal isolator includes a second channel having a third input 551 INB2 on the second circuit 520 that receives a second input signal INB2, a third output 552 on the second circuit 320, a fourth input 553 on the first circuit 510, and a fourth output 554 on the first circuit 510 that outputs a second output signal OUTB1. The fourth output 554 of the first circuit 510 is looped back to a receiver loopback element 557. The comparator 560 is configured to compare the input signal at the third input 551 to the loopback signal LB received at the received feedback element 557. The output of the comparator 560 is sampled by the D flip-flop 565 when the timer 562 times out. The timer 562 is coupled to the comparator 560 and has a duration that is at least two times greater than a propagation delay of an input signal received at the third input of the second circuit to sample comparator 560 at a specific time. The receiver element 523 and receiver loopback element 557 are coupled to the OR gate 570 so that a NULL at either element sets the STATUS1 signal to high. Likewise, the receiver loopback element 537 and receiver element 555 are coupled to the OR gate 544 so that a NULL at either element sets the STATUS1 signal to high, and the output 522 goes to a safe-state thereby indicating a fault if no signal is received.

The OR gate 570 generating the STATUS2 also receives an output of the OR gate 575 in which any error detected by UVLO 571, TSD 572, or I/O Detect 573 causes the STATUS2 to be set to high, indicating an error. The receiver elements 523 is tied to OR gate 570 so that any NULL value output by the receive element 523 will set the STATUS2 bit to high, indicating an error.

Figure 5A:
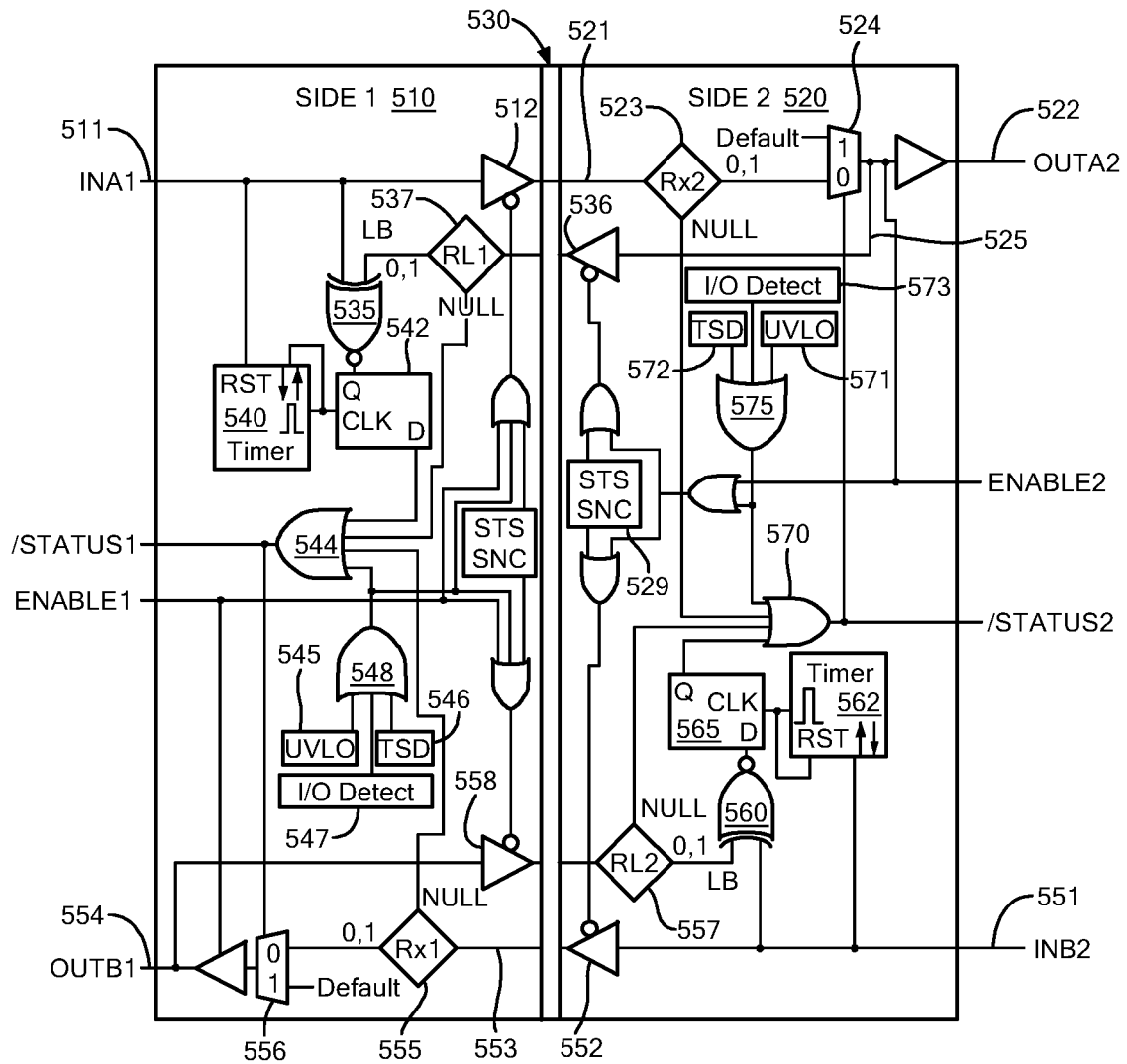
FIG. 5A shows a schematic block diagram of another embodiment of a digital signal isolator having two channels, one in one direction and the other in another direction.

FIG. 5A shows an isolator embodiment having some commonality with the isolator of FIG. 5 where like reference numbers indicated like elements. In a manner similar to that described in conjunction with FIG. 3A, signal loop back check occurs prior to the final output so that loop back is prior to the control of the safe state ON output. When a fault occurs the safe state will not interfere with the loop back. In addition, if the fault goes away the part can recover.

In the illustrated embodiment, the output 525 of element 520, which is prior to the isolator output signal 522 (OUTA2), is fed back to the comparison circuit 535 via buffer 536 and receiver loopback (RL1) element 537. The signal for OUTB1 is fed back in a similar manner to comparison circuit 560.

As described above, by feeding back from a point prior to the isolator output signal, when the input side status is activated the other transmission channel is controlled to intentionally send a faulty transmission, such as a DC condition, which is flagged by the logic on the output side of the boundary. This enables synchronization of the status bits on both sides of the boundary. The status bits on both sides of the isolation boundary can be synchronized.

In the illustrated embodiment, a status synchronization module 529 includes logic that monitors the loop back and compares to the input. Once the STS SNC module 529 detects a fault, it then takes control of the transmitter and intentionally sends a fault condition to the other side of the isolation boundary. In this way we can detect a fault on the opposite side from where it occurred in order synchronize the fault condition that shows up as the output state of status signal.

When a fault occurs, we control the other channel and intentionally disable the transmitter to send a fault. The system can control individually each channel depending on which channel detects a fault. In example embodiments, the channel that detects a fault controls the other channel to transmit a fault intentionally to synchronize the status of the other chip. Once the original fault condition clears then the status synchronization is ended and the other channel, e.g., the one not having the original fault, is freed to transmit data again.

Figure 6:
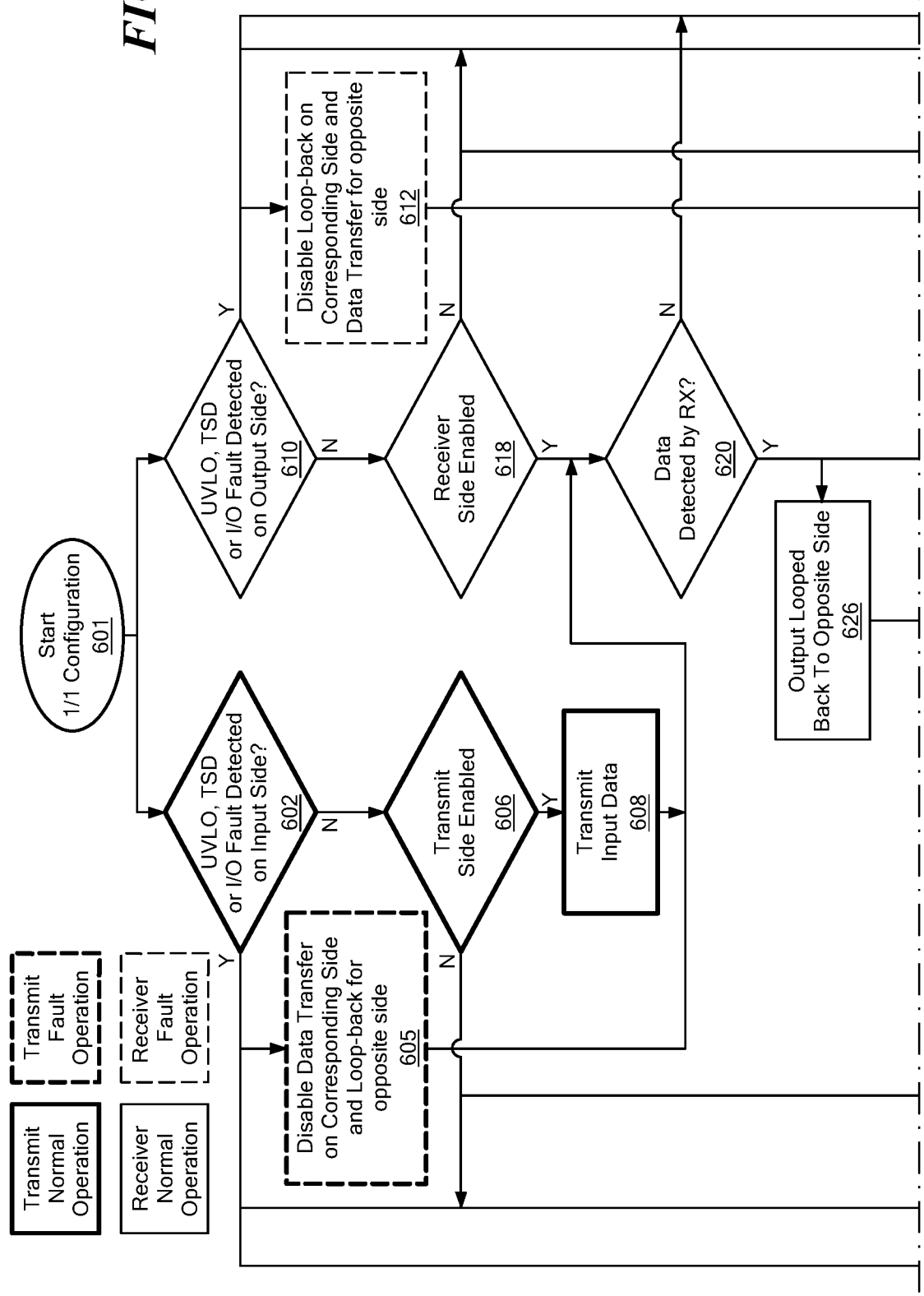
FIG. 6 is a flow chart of a method for implementing the digital signal isolator of FIG. 5.
Figure 6:
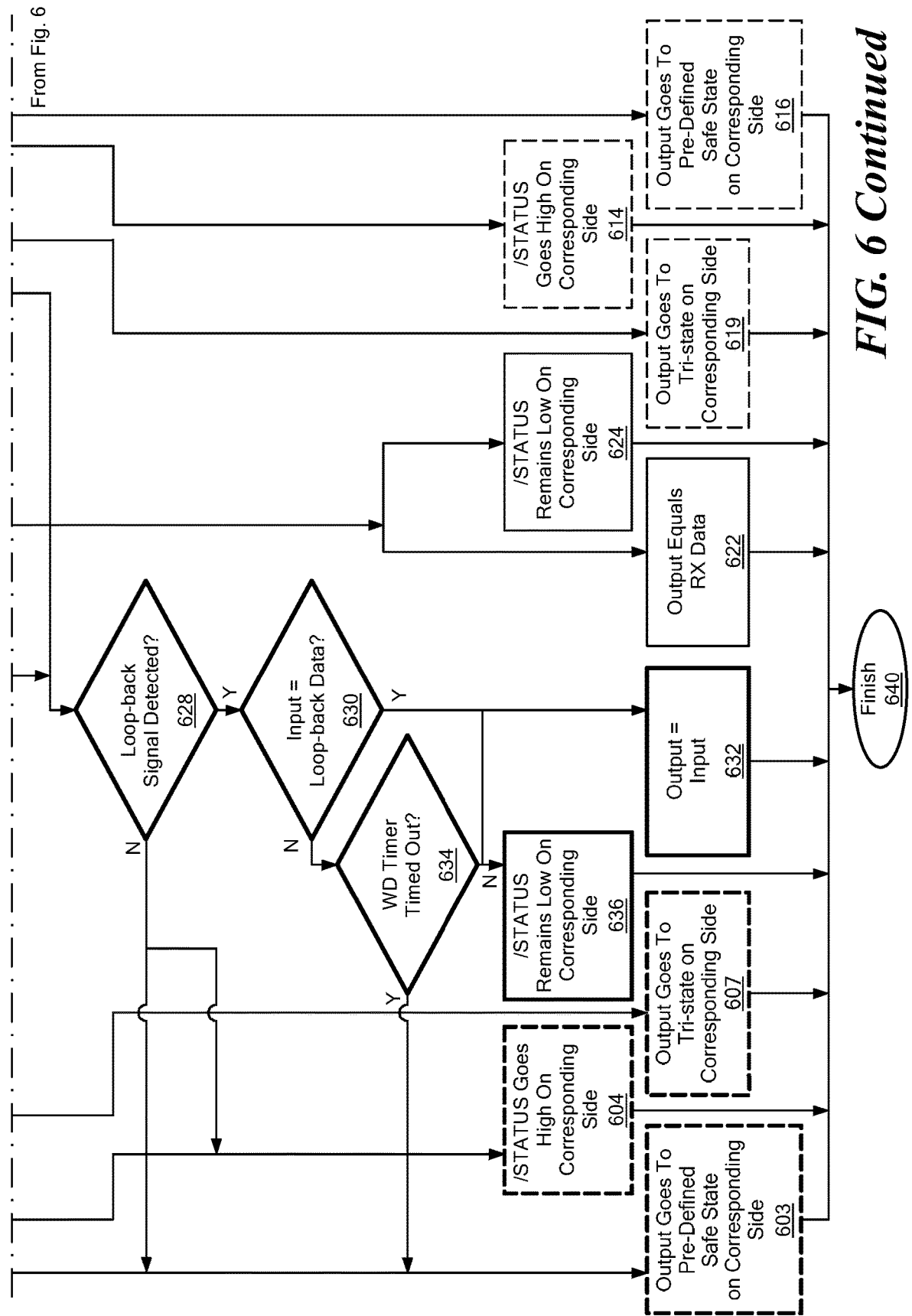

FIG. 6 is a flow chart of a method for implementing the digital signal isolator of FIG. 5. The method starts the dual-channel, opposite direction configuration at block 601, and advances to blocks 602 and 610, which may occur at the same time or substantially simultaneously. At block 602, a check is performed to verify if UVLO, TSD, or I/O Fault is detected on the input side. The input side may refer to the first side of the digital isolator, for example the first circuit 510 shown in FIG. 5, or may refer to the second circuit 520, depending upon the particular configuration of the channel as being an input side or an output side. If yes there is a fault on the input side at block 602, then at block 603 the output goes to a pre-defined safe-state on corresponding side and the STATUS goes high on the corresponding side at block 604.

Additionally, at block 605, the data transfer is disabled on the corresponding side and the loopback for the opposite side is disabled. The method then continues to block 620 to determine if data has been detected by the receiver.

If there is no fault detected on the input side at block 602, it is determined whether the transmit side is enabled at block 606. If the transmit side is not enabled at block 606, the procedure advances to block 604 to set the STATUS to high on the corresponding side and at block 607 the output goes to a third state on the corresponding side to indicate a fault or enable condition. If there is no fault detected at block 602 and the transmit side is enabled at block 606, the method continues to block 608 to transmit input data and then to block 620 to determine if data is detected by a receiver of the system.

At block 610 a check is performed to verify if UVLO, TSD, or I/O Fault is detected on the output side. The output side may refer to the first circuit 510 shown in FIG. 5 or may refer to the second circuit 510 in FIG. 5, depending upon which direction the channel is configured. If yes there is a fault at block 610, then at block 612 the loopback on the corresponding side is disabled and the data transfer for the opposite side is disabled. After the loopback and data transfer are disabled, the method continues to block 628 to determine if the loopback signal is detected. Additionally, if there is a fault at block 610, the STATUS bit goes high for the corresponding side at block 614 and the output goes to a pre-defined safe state on the corresponding side at block 616.

If there the receive side is enabled at block 618, the input side transmits data, and the method advances to block 620 to determine if data has been detected by a receiver (e.g., receiver element 523 or receiver element 555). At block 620, if data is detected by the receiver, then the output is equal to the receiver data at block 622, and the STATUS bit remains low on the corresponding side at block 624. Additionally, the output is looped back to the opposite side at block 626. If the data is not detected by a receiver at block 620, then the STATUS goes high on the corresponding side at block 614 and the output goes to a pre-defined safe-state (or other state of the digital isolator) on the corresponding side at block 616.

After the output is looped back to the opposite side at block 626, it is determined at block 628 whether the loopback signal is detected. For example, this can be performed by the loopback receiver element (e.g., 537, 557 in FIG. 5). If a loopback signal is detected at block 628, the method continues to block 630 to determine if the input matches the loopback data. If the input does match the loopback data, then the method continues to block 632 where the output is set to equal the input, and the method finished at block 640.

If there is no loopback signal detected at block 628, then continues to block 603 to put the output into a safe-state and 604 to stet the STATUS HI. If the LB signal is detected, and the input is not equal to the loopback data at block 630, the method continues to block 634 to determine inf the timer has timed out. If the timer has not timed out at block 634, the STATUS bit remains low on the corresponding side at block 636. If the timer has timed out at block 634, then the output goes to a pre-defined safe state on the corresponding side at block 603 and the STATUS bit goes high on the corresponding side at block 604.

Figure 7:
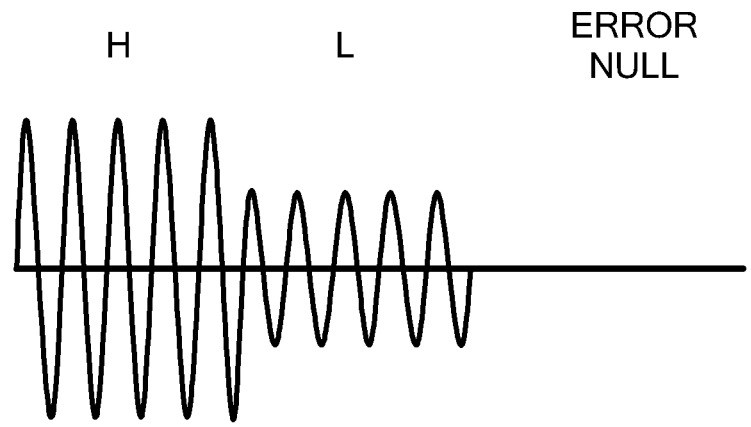
FIG. 7 shows a waveform of the three states of output, including the first amplitude for a logic high, the second amplitude for a logic low, and no output for an error or null signal.

Reference is now made to FIG. 7 showing a waveform of the three states of transmission across the barrier either data signal by transmission element 312 or 352 or LB signal by transmission element 336 or 358, including the first amplitude for a logic high, the second amplitude for a logic low, and no output for an error or null signal. The waveform for a logic high and a logic low can have a given frequency. Rather than a two-state digital signal isolator that only provides logic low and logic high, the three-state output includes the first amplitude for the logic high "H" which may be logic '1' shown in FIG. 3, the second amplitude for the logic low "L" which may be logic '0' shown in FIG. 3, and a third amplitude (zero in this case) can be used to convey a null state or an error state. This provides the three-state data transmission across the isolation barrier (e.g., barrier 330 in FIG. 3.). The receiver elements 323, 337, 355, 357 can each be configured to differentiate between the three states.

Figure 8:
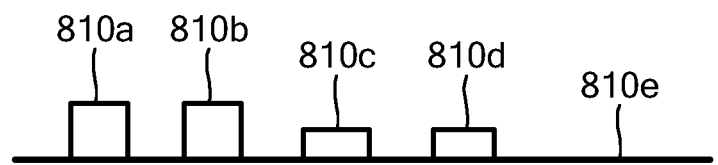
FIG. 8 shows a waveform of the three states of output, including a first pulse height for a logic high, a second pulse height for a logic low, and no output for an error or null signal.

FIG. 8 shows a waveform of the three states of output, including pulses 810a, 810b having a first pulse height representative of a logic high, pulses 810c, 810d having a second pulse height representative of a logic low, and no output for an error or null signal as shown at 810e. This provides a three-state output that includes a first pulse height for the logic high "H", the second pulse height for the logic low "L" and a third pulse height (none) for the null or error signal.

Figure 8A:
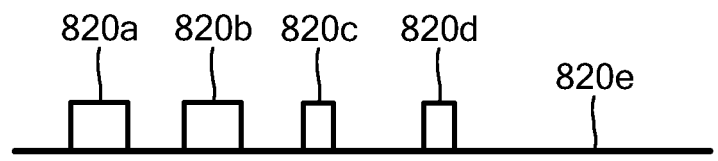
FIG. 8A shows a waveform of the three states of output, including a first pulse width for a logic high, a second pulse width for a logic low, and no output for an error or null signal.

FIG. 8A shows an example waveform of the three states of output, including pulses 820a, 820b having a first pulse width representative of a logic high, pulses 820c, 820d having a second pulse width representative of a logic low, and no output for an error or null signal as shown at 820e. This provides a three-state output that includes a first pulse width for the logic high "H", the second pulse width for the logic low "L" and a third pulse width (none) for the null or error signal.

It will be appreciated that although only two additional states are shown and described in various places herein, to provide three total states at the output, this can readily be scaled to any number of states, for example five states each having a different amplitude. Likewise, amplitude is not the only means for conveying a different state. For example, pulse width or pulse height could be used to convey the various states, with each state corresponding to a specific pulse width and/or pulse height. Further, although the term "state" is used herein to refer to various indicators of information (e.g., first state for high, second state for low, third state for null/no signal/error) that is provided across the isolation barrier layer and/or output by the digital isolator itself. For example, the three states across the isolation barrier can comprise a first state for logical high, a second state for logical low, and a third state for no signal or an error signal received from the loopback element. The three states output by the digital isolator can include a first state for logical high, a second state for logical low, and a third state indicating a safe-state for the digital isolator due to the detection of a fault or other error. In some techniques, rather than a "state" to provide an indication of information representative of data, a particular symbol can be used, with one unique symbol provided for each set of data (e.g., first symbol for logical high, second symbol for logical low, and third symbol for no signal or an error signal). The symbols can include two different amplitudes of any shape waveform, two difference frequencies of a sine waveform, one or more pulses of different amplitude at a transition from logic 1 to logic 0 to the opposite state, one or more pulses of different polarity at a transition from logic 1 or logic 0 to the opposite state, any number of pulses at a transition from logic 1 to logic 0 to the opposite state, or any other symbol indicating a logic 1 or logic 0. Various techniques can be implemented for providing the output signal, including amplitude modulation, pulse-width modulation, and other modulation techniques.

Figure 9:
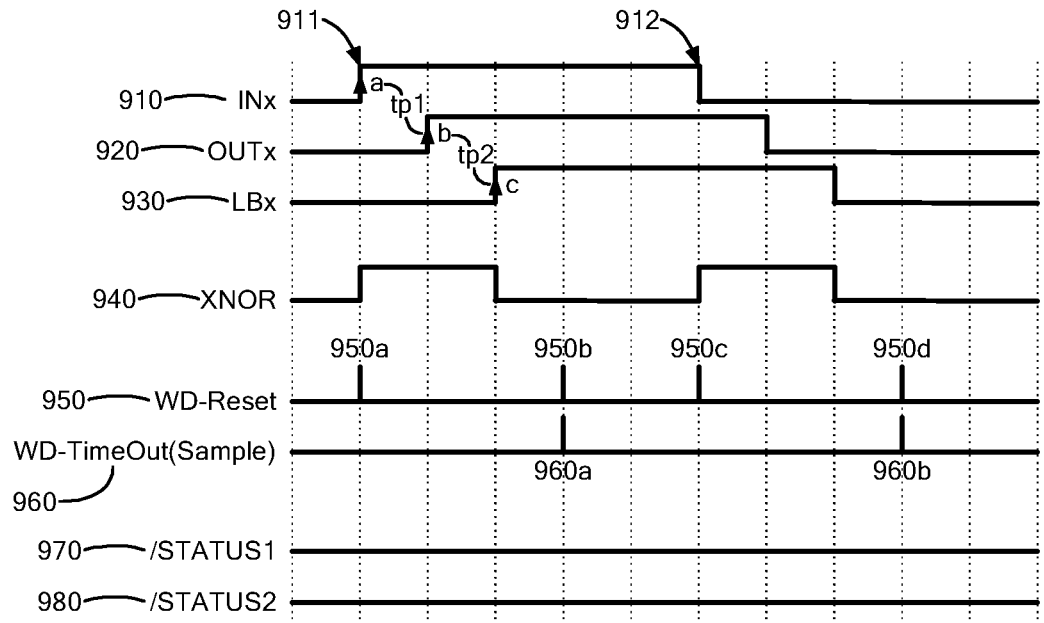
FIG. 9 shows timing diagrams for normal operation of the two-channel configuration with both channels flowing in a same direction.

FIG. 9 shows timing diagrams for normal operation, e.g., no status faults, of the two-channel, same direction configuration, according to the present disclosure. The timing diagram includes the "IN" input signal 910, the "OUT" output signal 920, and the "LBx" loopback signal 930. With reference to FIG. 3, the "IN" signal 910 may correspond to the INA1 signal 311 or the INB1 signal 351, the "OUT" signal 920 may correspond to the OUTA2 signal 322 or OUTB2 signal 354, and the loopback signal 930 may correspond to the LB signal input to the comparator 335 or the LB signal input to the comparator 351. Note the propagation delay 'tp1' between the rising edge (a) of the input and the rising edge (b) of the output, and the propagation delay 'tp2' between the rising edge (b) of the output and the rising edge (c) of the loopback signal. The "XNOR" comparator output 940, is high when the input 910 does not match the loopback signal 930 and is low when the input 910 does match the loopback signal. Note that if the D flip-flop were to sample the comparator output too soon (i.e., directly at the transition of the output signal) this would result in an error due to the loopback signal not matching the input signal because of the propagation delays. Thus, by implementing the timer, which may be referred to as a "watchdog" (WD) timer herein, it can be ensured that the flip-flop samples the comparator output at the correct time, equal to tp1 plus tp2 plus some additional time to ensure that race conditions do not occur between inputs to the XNOR comparator.

The "WD Reset" reset signal 950 for the timer is shown. The pulses 950a, 950b, 950c, 950d illustrate when the timer is reset. Note that the timer can be configured to reset each time that an input transition occurs. Note that timer reset 950a corresponds to input transition 911, and timer reset 950c corresponds to input transition 912. The timer can also be configured to reset each time that the timer is timed out, so that following a time out it is reset. The timer reset 950b corresponds to time out 960a, and the timer reset 950d corresponds to time out 960b. Note that the STATUS1 and STATUS2 signals 970, 980 are both low as the input matches the output and there is no error or fault detected.

Figure 10A:
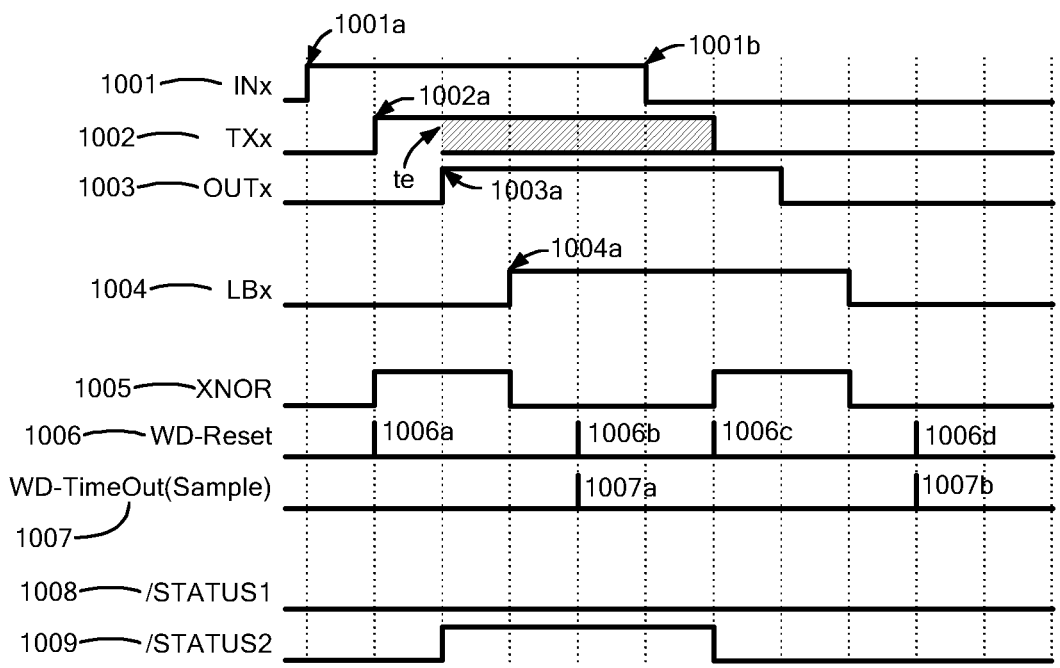
FIG. 10A shows timing diagrams for a signal failure with safe-state HI for the two-channel configuration, with both channels flowing in a same direction.

FIG. 10A shows timing diagrams for a signal failure for the two-channel configuration, with both channels flowing in a same direction (see, for example, a two-channel same direction configuration shown in FIG. 3). The timing diagram includes an "IN" input signal 1001, a TX transmitted signal 1002, an OUT output signal 1003, and a LBx loopback signal 1004. With reference to FIG. 3, the "IN" signal 1001 may correspond to the INA1 signal 311 or the INB1 signal at input 351, the Tx signal 1002 may correspond to the signal transmitted out by receiver (Rx2) element 323 or 355, the OUT signal 1003 may correspond to the OUTA2 signal at output 322 or OUTB2 signal at output 354, and the loopback LB signal 1004 may correspond to the LB signal input to the comparator 335 or the LB signal input to the comparator 351. In this example, there is an error at the receiver element (e.g., 323 or 355). As shown, the input IN goes high at transition 1001a, the transmitted signal goes high at transition 1002a, the output OUT goes high at transition 1003a, and the loopback LB signal goes high at transition 1004a as in normal operation. The TXx signal 1002 goes high at transition 1002a, and at time to an error occurs in the signal so that receiver element 323 activates the NULL signal to the OR gate 380, which causes STATUS2 to become active, indicating a fault. In this embodiment, element 324 is set to safe-state at logic 1 so that the OUTX signal 322 remains logic 1 until the transmission TXx becomes correct again. The loopback signal LB 1004 tracks the OUTx signal.

The "XNOR" comparator output 1005 is high when the input 1001 does not match the loopback signal 1004 and is low when the input 1001 does match the loopback signal 1004. The "WD-Reset" timer reset signal 1006 is shown, having pulses 1006a and 1006c that coincide, respectively, with transitions 1001a and 1001b of the input signal 1001.

After a predetermined period of time, which is at least two times the propagation delay of the input signal, the timer times out, as shown at "WD-TimeOut(Sample)" signal 1007 having pulses 1007a and 1007b that coincide with the timeout of the timer and, thus, the sampling of the comparator (XNOR signal 1005). The timer can also be configured to reset each time that the timer is timed out, so that following a time out of the timer it is also reset and, thus, the sampling of the comparator (XNOR signal 1005). For example timer reset 1006b can correspond to time out 1007a, and the timer reset 1006d can correspond to time out 1007b. Note that the sample at 1007a results in STATUS1 signal 1008 being low due to XNOR being low, and likewise the sample at 1007b results in STATUS1 signal 1008 remaining low due to XNOR being low. The STATUS2 signal 1009 goes high when the error in the transmitter signal 1002 occurs, and STATUS2 signal 1009 returns low on the next WD rest after the error in the signal 1002 resolves itself.

Figure 10B:
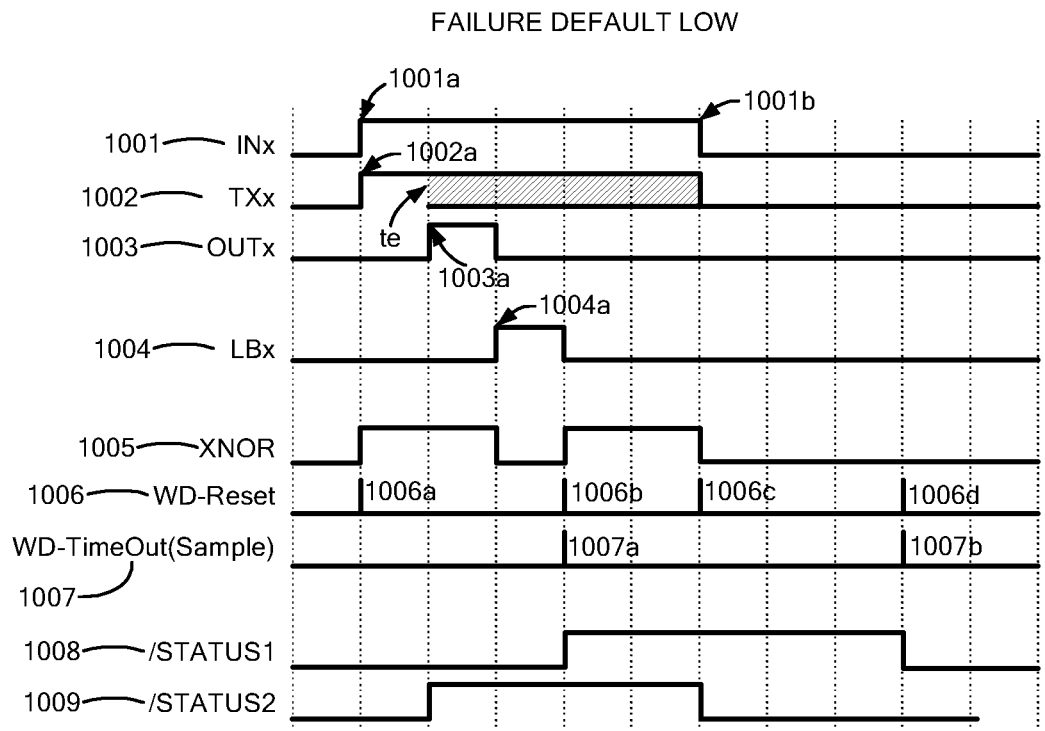
FIG. 10B shows timing diagrams for a signal failure with safe-state LO for the two-channel configuration, with both channels flowing in a same direction.

FIG. 10B shows element 324 being set to safe-state to LO. The error in the transmit signal TXx, after a time delay, causes the OUTx signal to safe-state LO from the initial HI. The loopback signal LB also transitions LO after a delay. Since the input signal INx and loopback signal do not match, the XNOR signal goes HI, which causes the STATUS1 signal to become active when the WD timer times outs 1007a and the XNOR is sampled. The STATUS2 signal transitions in the same way as described above when the element 324 safe-states HI.

Figure 10C:
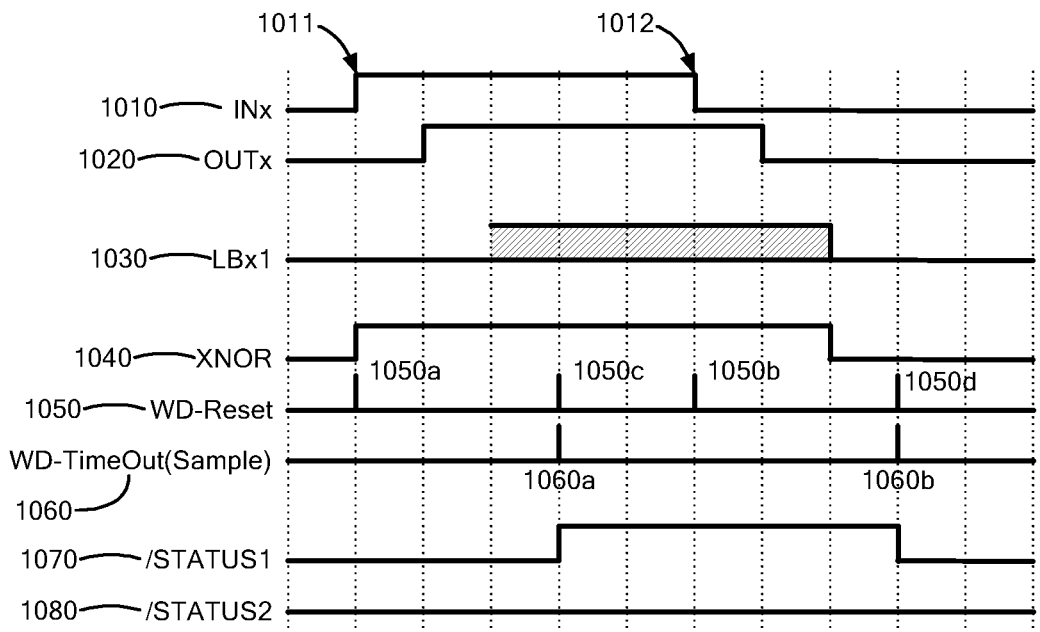
FIG. 10C shows timing diagrams for a loopback signal failure for the two-channel configuration, with both channels flowing in a same direction.

FIG. 10C shows timing diagrams for a loopback signal failure for the two-channel configuration, with both channels flowing in a same direction (see, for example, FIG. 3 for an example configuration). The timing diagram includes the "IN" input signal 1010, the "OUT" output signal 1020, and the "LBx" loopback signal 1030. With reference to FIG. 3, the "IN" input signal 1010 can correspond to the INA1 signal received at input 311 or the INB1 signal received at input 551, the "OUT" output signal 1020 can correspond to OUTA2 output signal at output 322 or the OUTB2 output signal at output 354, and the loopback signal 1030 can correspond to the LB signal input to the comparator 335 or the LB signal input to the comparator 360. In this example, the input signal IN 1010 is accurately transmitted to the output, however there is an error in the loopback LB signal 1030 itself, such as no loopback signal being detected. With reference to FIG. 3, for example, the input signal INA1 at input 311, and the output signal OUT at output 322 are functioning properly, with the receiver Rx2 element 323 properly sensing the value to the output. However, there is an error in the loopback signal (e.g., transmitted by receiver loopback RL1 element 337). Note that in this case there is a loopback signal failure, which for example can represent no loopback signal being detected or the wrong loopback signal being detected. As described herein, a fault on the loopback receiver will cause the STATUS1 bit to go high, indicating a fault.

The "XNOR" comparator output 1040, is high when the input 1010 does not match the loopback signal 1030 and is low when the input 1010 does match the loopback signal 1030. The XNOR output 1040 can be the output of comparator 335 or comparator 360 in FIG. 3. The "WD-Reset" timer reset signal 1050 is shown, having pulses 1050a and 1050b that coincide, respectively, with transitions 1011 and 1012 of the input signal 1010. After a predetermined period of time, which is at least two times the propagation delay of the input signal, the timer times out, as shown at "WD-TimeOut(Sample)" signal 1060 having pulses 1060a and 1060b that coincide with the timeout of the timer and, thus, the sampling of the comparator. The timer reset signal 1050 also includes pulse 1050c and 1050d that coincide, respectively, with timeout pulses 1060a and 1060b. Note that the sample at 1060a results in STATUS1 signal 1070 going active due to the XNOR signal 1040 being high.

Figure 11A:
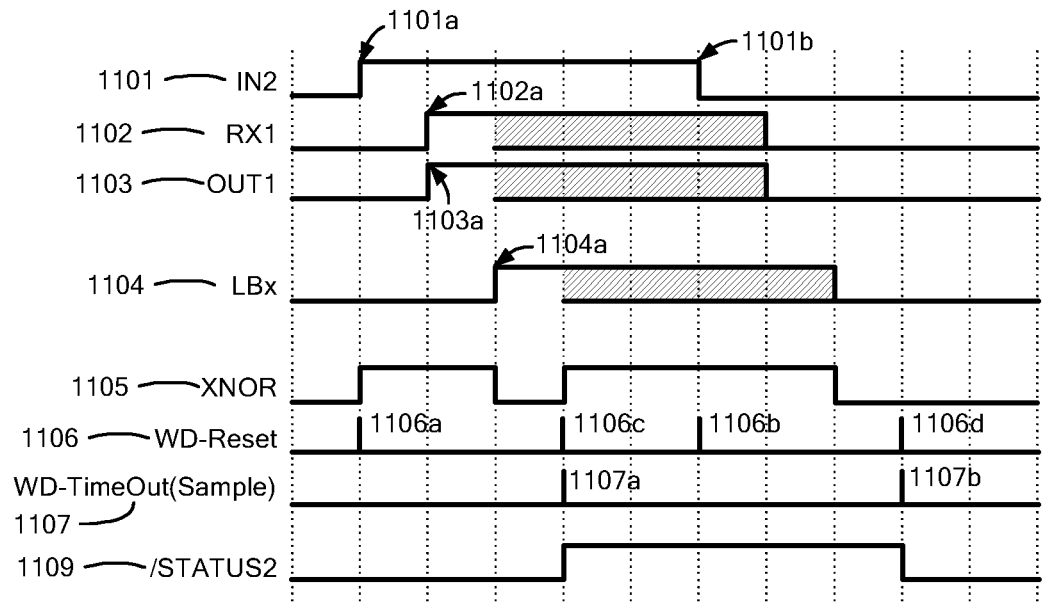
FIG. 11A shows timing diagrams for a receiver signal failure for the two-channel configuration, with one channel flowing in one direction and the other channel flowing in the opposite direction.

FIG. 11A shows timing diagrams for a receiver signal failure for a two-channel, opposite direction configuration, with one channel flowing in one direction and the other channel flowing in the opposite direction (e.g., a two-channel opposite direction configuration shown in FIG. 5). In this example, the input is accurately transmitting data to the output, however there is an error in the receiver signal (for example, an error in receiver Rx1 element 555 or Rx2 element 523). The "IN1" input signal 1110 can correspond to the INA signal at input 511 or the INB2 signal at input 551, the "OUT2" signal 1120 can correspond to OUTA2 signal at output 522 or the OUTB1 signal at output 554, and the loopback LB1 signal 1130 can correspond to the LB signal input to the comparator 535 or the LB signal input to the comparator 560. As will be appreciated, any error on the receiver Rx1 element 555 will cause STATUS1 to be active as the NULL output from the receiver Rx1 element goes active. Note that the sample at 1107c upon the WD SIGNAL 1107 timeout results in STATUS2 signal 1109 transitioning to high due to XNOR signal 1105 being high, and the sample at 1107a results in STATUS2 signal 1109 being set to low due to the XNOR signal 1105 transitioning to low. The "XNOR" comparator output 1105 is high when the input 1101 does not match the loopback 1104 and is low when the input 1101 does match the loopback 1104. The "WD-Reset" timer reset signal 1106 is shown, having pulses 1106a and 1106b that coincide, respectively, with transitions 1101a and 1101b, respectively, of the input signal 1101. After a predetermined period of time, which is at least two times the propagation delay of the input signal, the timer times out, as shown at "WD-TimeOut(Sample)" signal 1107 having pulses 1107a and 1107b that coincide with the timeout of the timer and, thus, the sampling of the comparator. The reset signal 1106 also includes pulses 1106c and 1106d that coincide, respectively, with timeout pulses 1107a and 1107b, respectively. Note that the sample at 1107a results in STATUS2 signal 1109 being set to high due to the XNOR signal 1105 being high, and then the STATUS2 signal 1109 returning to zero when the sample at 1107b occurs due to the XNOR signal 1105 being low.

Figure 11B:
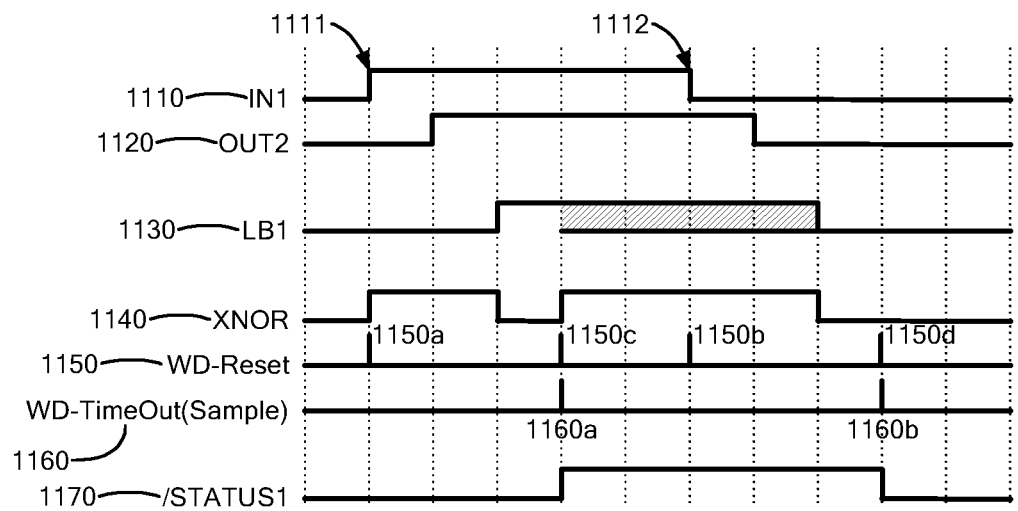
FIG. 11B shows timing diagrams for a loopback signal failure for the two-channel configuration, with one channel flowing in one direction and the other channel flowing in the opposite direction.

FIG. 11B shows timing diagrams for a loopback signal failure for the two-channel, opposite direction configuration, with one channel flowing in one direction and the other channel flowing in the opposite direction. In this example, the input is accurately transmitting data to the output, and the output is accurately outputting data, however there is an incorrect (or no) loopback (LB) signal detected by the receiver element (e.g., 557). The timing diagram includes the "IN" input signal 1110, the "OUT" output signal 1120, the "LBx" loopback signal 1130. With reference to FIG. 5, the "IN" input signal 1110 can correspond to the INA signal at input 511 or the INB2 signal at input 551, the "OUT" output signal 1120 can correspond to OUTA2 signal at output 522 or the OUTB1 signal at output 554, and the loopback signal 1130 can correspond to the LB signal input to the comparator 535 or the LB signal input to the comparator 560. The "XNOR" comparator output 1140 is high when the input 1110 does not match the loopback signal 1130 and is low when the input 1110 does match the loopback signal 1130. The "WD-Reset" timer reset signal 1150 is shown, having pulses 1150a and 1150b that coincide, respectively, with transitions 1111 and 1112, respectively, of the input signal 1110. After a predetermined period of time, which is at least two times the propagation delay of the input signal, the timer times out, as shown at "WD-TimeOut (Sample)" signal 1160 having pulses 1160a and 1160b that coincide with the timeout of the timer and, thus, the sampling of the comparator. The reset signal 1150 also includes pulses 1150c and 1150d that coincide with the timeout pulses 1160a and 1160b, respectively. Note that the sample at 1160a results in STATUS1 signal 1170 being set to high due to the XNOR signal 1040 being high, and then the STATUS1 signal 1170 returning to zero when the sample at 1160b occurs due to the XNOR signal 1040 being low. Note that the result would be the same if the loopback (LB) signal was low (instead of none/null), still indicating a fault by XNOR being high when the WD timer times out, and the STATUS1 then going active, thereby indicating the fault.

It should be appreciated that the signal isolator IC packages shown and described in connection with figures above are but several of many potential configurations of signal isolator IC packages in accordance with the embodiments of the disclosure. As one example, a signal isolator IC package according to a further embodiment of the disclosure may take the form of a three-dimensional (3D) IC package including a plurality of vertically stacked die and an isolation barrier (or barriers) supported by respective die of the IC package. The 3D IC package, similar to IC packages shown and described in connection with figures above, may support two or more voltage domains.

Additionally, it should be appreciated that the example isolation barriers of the signal isolator IC packages shown and described in connection with figures above are but several of many potential configurations of isolation barriers in accordance with the embodiments of the disclosure. For example, while the isolation barriers are shown as including a particular number of conductive layers, insulating layers, and floating conductive plates (collectively, "isolation layers"), it should be appreciated that isolation barriers in accordance with embodiments of the disclosure may include more the particular number of isolation layers in some embodiments. Although the timing diagrams is for the receiver signal and the loopback signal are shown in detail, it will be appreciated that the techniques can readily be applied to other signals and other faults at any of a variety of locations within the digital isolator.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A signal isolator integrated circuit package comprising:
a first circuit having a first input and a first output;
a second circuit having a second input and a second output, wherein the first circuit is disposed on a first die and the second circuit is disposed on a second die, different from the first die;
an isolation barrier layer between the first circuit and the second circuit, wherein the second output of the second circuit is coupled to the first input of the first circuit through the isolation barrier; and
a comparison circuit configured to compare the first input of the first circuit to the second output of the second circuit,
wherein the second output is configured to convey at least three states, including a first state indicative of a logical high of an input signal received at the first input, a second state indicative of a logical low of the input signal, and a third state indicative of a fault condition.

2. The signal isolator of claim 1, wherein the comparison circuit includes a comparator.

3. The signal isolator of claim 1, wherein the second output is configured to convey at least three symbols, including a first symbol indicative of a logical high of an input signal received at the first input, a second symbol indicative of a logical low of the input signal, and a third symbol indicative of a parameter of the input signal.

4. The signal isolator of claim 3, wherein the parameter of the input signal is at least one of: a clock signal corresponding to the input signal, a fault signal indicative of no input signal, or an error signal indicating that the first input does not equal the second input.

5. The signal isolator of claim 1, further comprising a receiver feedback element between the second output and wherein the comparison circuit is configured to identify a null condition to trigger the third state.

6. The signal isolator of claim 1, wherein the logical high is provided as a first amplitude and the logical low is provided as a second amplitude, different than the first amplitude, and wherein the third state comprises a third amplitude, different than the first amplitude and the second amplitude.

7. The signal isolator of claim 6, wherein the third amplitude comprises zero.

8. The signal isolator of claim 1, wherein the logical high is provided as a first pulse width and the logical low is provided as a second pulse width, different than the first pulse width, and wherein the third state comprises no output (zero).

9. The signal isolator of claim 1, wherein the logical high is provided as a first pulse height and the logical low is provided as a second pulse height, different than the first pulse height, and wherein the third state comprises no output (zero) indicative of a fault condition.

10. The signal isolator of claim 1, wherein the first output is further configured to convey at least a fourth state indicative of a second condition, different than the fault condition, that is indicative of a specific condition of the signal or of the signal isolator.

11. The signal isolator of claim 10, wherein the fourth state is conveyed as a fourth amplitude, different than the first amplitude, different than the second amplitude, and different than the third amplitude.

12. The signal isolator of claim 1, further comprising a timer coupled to the comparison circuit to sample the output of the comparison circuit at a specific time.

13. The signal isolator of claim 1, wherein the first circuit is disposed on a first die and the second circuit is disposed on a second die, different from the first die.

14. The signal isolator of claim 1, wherein the first circuit includes a third input and a third output, and the second circuit includes a fourth input and a fourth output, and wherein the first circuit includes a second comparison circuit configured to compare the third input of the first circuit to the fourth output of the second circuit.

15. The signal isolator of claim 1, wherein the second circuit includes a third input and a third output, and the first circuit includes a fourth input and a fourth output, wherein the second circuit includes a second comparison circuit configured to compare the third input of the second circuit to the fourth output of the first circuit.

16. The signal isolator of claim 1, further comprising a status output to convey a fault in at least one of the first circuit or the second circuit.

17. The signal isolator of claim 1, further including a tri-state buffer configured to receive the second output of the second circuit and generate an external output for the signal isolator integrated circuit package.

18. A method implementing a signal isolator having a first circuit separated from a second circuit by an isolation barrier layer, the method comprising:
receiving an input signal at an input of the first circuit of the signal isolator, the input having a logical high or a logical low value;
providing an output signal at an output of the second circuit as at least one of three states, wherein a first state is indicative of the logical high of the input signal, a second state is indicative of the logical low of the input signal, and a third state is indicative of a first condition, wherein the first circuit is disposed on a first die and the second circuit is disposed on a second die, different from the first die; and
comparing the output of the second die to the input of the first die to provide a compared output.

19. The method of claim 18, wherein the first state is indicated by a first amplitude, the second state is indicated by a second amplitude, and the third state is indicated by a third amplitude.

20. The method of claim 19, wherein the third amplitude comprises zero.

21. The method of claim 19, wherein the output signal further comprises a fourth state indicated by a fourth amplitude, indicative of a specific condition, different than the first condition.

22. The method of claim 18, further comprising sampling the compared output when timer times out.

23. The method of claim 18, further comprising embedding clock data within the output, such that the third state provides the clock signal as the first condition of the signal isolator.

24. The method of claim 18, wherein the first state is indicated by a first symbol, the second state is indicated by a second symbol that is different from the first symbol, and the third state is indicated by a third symbol that is different from the first and second symbols.

25. The method of claim 18, further including employing a tri-state buffer to receive the second output of the second circuit and generate an external output for the signal isolator integrated circuit package.

26. A method implementing a signal isolator having a first circuit separated from a second circuit by an isolation barrier, the first circuit having a first input and a first output, the second circuit having a second input and a second output, the method comprising:
receiving an input signal at the first input of the first circuit;
sending an output signal at the second output of the second circuit back, across the isolation barrier, to a comparison circuit;
comparing the output signal to the input signal by the comparison circuit; and
providing an output as one of at least three states, wherein a first state is indicative of a logical high of the input signal, a second state is indicative of logical low of the input signal, and a third state indicative of a fault condition when the output signal is not equal to the input signal,
wherein the first circuit is disposed on a first die and the second circuit is disposed on a second die, different from the first die.

27. The method of claim 26, further comprising setting a status bit on the signal indicator to indicate a fault of the signal isolator.

* * * * *